United States Patent
Metawea

(10) Patent No.: US 11,356,147 B1
(45) Date of Patent: Jun. 7, 2022

(54) FEEDBACK-PAUSE-CONTROLLED RADIOFREQUENCY CARRIER TRACKING FOR AMPLITUDE-MODULATED SIGNALS WITH AN UNSTABLE REFERENCE CLOCK

(71) Applicant: SHENZHEN GOODIX TECHNOLOGY CO., LTD., Shenzhen (CN)

(72) Inventor: Ahmed Sayed Abbas Metawea, Cairo (EG)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/110,308

(22) Filed: Dec. 3, 2020

(51) Int. Cl.
*H03L 7/085* (2006.01)
*H04B 5/00* (2006.01)
(Continued)

(52) U.S. Cl.
CPC .......... *H04B 5/0062* (2013.01); *G06K 19/073* (2013.01); *G06K 19/0723* (2013.01);
(Continued)

(58) Field of Classification Search
CPC ......... H03L 7/085; H03L 7/087; H03L 7/089; H03L 7/0891; H03L 7/0893
See application file for complete search history.

(56) References Cited

U.S. PATENT DOCUMENTS

| 5,539,345 A | * | 7/1996 | Hawkins | G06F 1/12 327/12 |
| 2001/0043086 A1 | * | 11/2001 | Idei | H03D 13/004 327/12 |
| 2007/0024335 A1 | * | 2/2007 | Sato | H03L 7/0891 327/158 |

(Continued)

FOREIGN PATENT DOCUMENTS

| WO | 2013063500 A2 | 5/2013 |
| WO | 2013063500 A3 | 5/2013 |

OTHER PUBLICATIONS

European Patent Office, extended European search report issued in Application No. 21199214.4, dated Mar. 23, 2022, Germany 8 pages.

*Primary Examiner* — Levi Gannon
(74) *Attorney, Agent, or Firm* — Kilpatrick Townsend & Stockton LLP

(57) ABSTRACT

Techniques are described for accurate tracking of a radiofrequency (RF) carrier for amplitude-modulated signals in unstable reference clock environments. For example, some embodiments operate in context of clock circuits in devices configured for near-field communication (NFC) card emulation (CE) mode. The clock circuits seek to generate an internal clocking signal by tracking a clock reference, such as an RF carrier. In some cases, the clock reference can unpredictably become unreliable for periods of time, during which continued tracking of the unreliable clock reference and/or improper reacquisition can yield appreciable fre- (Continued)

quency and phase errors in the generated internal clocking signal. Some embodiments implement phase delta detection with time limiting to limit the magnitude of such errors in the internal clocking signal introduced while tracking an unreliable clock reference. Other embodiments provide feedback-pause-control (FPC) to force proper clock reference reacquisition. Such FPC can be implemented additionally with time-limited phase detection.

18 Claims, 17 Drawing Sheets

(51) Int. Cl.
*G06K 19/07* (2006.01)
*H04W 4/80* (2018.01)
*G06K 19/073* (2006.01)
*H03L 7/08* (2006.01)
*H04L 7/00* (2006.01)

(52) U.S. Cl.
CPC .............. *H03L 7/08* (2013.01); *H03L 7/085* (2013.01); *H04B 5/0031* (2013.01); *H04B 5/0068* (2013.01); *H04L 7/00* (2013.01); *H04W 4/80* (2018.02)

(56) References Cited

U.S. PATENT DOCUMENTS

| | | | |
|---|---|---|---|
| 2008/0197896 A1* | 8/2008 | Truppel | H04L 7/041 327/156 |
| 2009/0262876 A1 | 10/2009 | Arima et al. | |
| 2010/0197349 A1 | 8/2010 | Morita et al. | |
| 2015/0072737 A1 | 3/2015 | Morita et al. | |

\* cited by examiner

FEEDBACK-PAUSE-CONTROLLED RADIOFREQUENCY CARRIER TRACKING FOR AMPLITUDE-MODULATED SIGNALS WITH AN UNSTABLE REFERENCE CLOCK

FIELD OF THE INVENTION

The present invention relates generally to clock recovery circuits. More particularly, embodiments relate to rapid and accurate tracking of a radiofrequency (RF) carrier for amplitude-modulated signals in unstable reference clock environments, such as for phase-lock loop (PLL) circuits integrated in mobile electronic devices for use with near-field communication (NFC) card emulation (CE) mode communications.

BACKGROUND OF THE INVENTION

Various types of short-range radiofrequency (RF) communications are becoming ubiquitous for a wide range of applications, such as for contactless access cards, contactless payment cards, contactless interfaces between devices and peripherals, etc. Near-Field Communications (NFC) is one such RF communications technology that uses inductive coupling between devices to effect contactless exchange of data between devices over a short range (e.g., around 1.5 inches). Many NFC applications support passive NFC devices, such as a passive card or a passive tag. In such applications, the passive device includes one or more integrated chips and an integrated antenna, but no battery. When the passive device is being read by an active reader device, the reader sends a command transmission over an RF carrier (typically by amplitude shift key (ASK) modulation of the carrier signal). The RF carrier induces a current in the antenna of the passive device, which can be harvested by the passive device to power and clock its integrated chip(s). The activated chip(s) can then automatically respond by sending back a signal over the RF carrier, with the response signal being actively modulated according to data stored on the passive device. The reader can detect and process the response signal to recover the transmitted data.

In such a passive NFC transaction, operation of the passive device may rely on generating and maintaining a reliable clock that accurately tracks the RF carrier. However, in some modes of operation, RF carrier tends not to provide a reliable clock reference for the passive device. For example, in a so-called card emulation (CE) mode, a smart phone, or portable electronic device is configured to emulate a passive NFC device. The portable electronic device may have a relatively small antenna, such that only a small signal level is received from the reader; and the portable electronic device may rely on phase-lock loops (PLLs) or other clock circuits to generate a stable and accurate internal clock signal from the received small-signal RF carrier. In such cases, the ASK modulation of the RF carrier by the reader, and/or active load modulation (ALM) by the passive device can tend to limit the ability of the passive device to generate and maintain an accurate internal clock signal from the RF carrier.

BRIEF SUMMARY OF THE INVENTION

Embodiments provide circuits, devices, and methods for accurate tracking of a radiofrequency (RF) carrier for amplitude-modulated RF signals in unstable reference clock environments. For example, some embodiments can operate in context of phase-lock loop (PLL) circuits integrated in mobile electronic devices for use with a near-field communication (NFC) card emulation (CE) mode of operation. During operation, the RF carrier can become an unreliable clock reference for an emulated-passive device (i.e., an electronic device operating in NFC CE mode) due, for example, to amplitude modulation of the RF carrier by the reader, and/or to active load modulation of the RF carrier by the emulated-passive device. It can be desirable to stop the PLL from tracking the RF carrier during times when the RF carrier is unreliable (i.e., as a clock reference), and it can be desirable to reacquire the clock for tracking when the clock reference returns to being reliable.

However, when the reliability of the clock reference is lost, it can take time to detect this condition and to stop tracking, leaving a time window during which the PLL continues to track an unreliable reference. Some embodiments described herein seek to limit the amount of per-cycle phase and/or frequency error introduced in the PLL output while tracking an unreliable reference in such a timeframe. For example, the PLL can track the reference by asserting phase tracking signals to maintain phase alignment between its output and its input reference, and some embodiments provide adjustable time-limited gating of those phase tracking signals to limit the amount of phase and/or frequency error introduced by the PLL while the reference is unreliable. Other embodiments seek to address errors that can occur during reacquisition of the reference. For example, when the PLL is returned to a tracking mode (after it is detected that the clock reference is again reliable), the PLL can make incorrect initial compensation decisions, which can introduce appreciable phase and/or frequency error until the PLL ultimately recovers. Some embodiments provide feedback-pause-control of phase detection to force the PLL to make the correct initial compensation determinations in such a case. Some such embodiments configure the feedback-pause-control to also provide time limiting features, such as adjustable time-limited gating of phase tracking signals.

According to one set of embodiments, a time limiter circuit is provided for integration with a phase detector of a phase-locked loop (PLL). The time limiter circuit includes: an absolute phase detection sub-circuit to detect whether a phase tracking signal is asserted by the phase detector, the phase tracking signal indicating a detected phase difference between an output signal of the PLL and an input reference signal of the PLL; a delay timer sub-circuit, coupled with the absolute phase detection sub-circuit to determine, automatically responsive to the absolute phase detection sub-circuit detecting that the phase tracking signal is asserted, whether a signal duration of the phase tracking signal exceeds a threshold duration; and a pulse gating sub-circuit, coupled with the delay timer sub-circuit to force de-assertion of the phase tracking signal for at least a remainder of a present operating cycle of the PLL automatically responsive to the delay timer sub-circuit determining that the signal duration exceeds the threshold duration.

According to another set of embodiments, a phase-locked loop (PLL) circuit is provided. The PLL circuit includes: a PLL input node to receive a reference clock signal; a PLL output node to output a generated clock signal; and a phase detector, coupled with the PLL input node and the PLL output node to generate a phase tracking signal indicating a phase difference between the reference clock signal and the generated clock signal. The phase tracking signal includes a first phase tracking signal responsive to a phase of the reference clock signal preceding a phase of the generated clock signal, and a second phase tracking signal responsive to the phase of the generated clock signal preceding the phase of the reference clock signal. The phase detector has a time limiter circuit, including: an absolute phase detection sub-circuit to detect whether the phase tracking signal is asserted by the phase detector; a delay timer sub-circuit, coupled with the absolute phase detection sub-circuit to determine, automatically responsive to the absolute phase detection sub-circuit detecting that the phase tracking signal is asserted, whether a signal duration of the phase tracking signal exceeds a threshold duration; and a pulse gating sub-circuit, coupled with the delay timer sub-circuit to force de-assertion of the phase tracking signal for a remainder of at least a present operating cycle of the PLL automatically responsive to the delay timer sub-circuit determining that the signal duration exceeds the threshold duration. In some such embodiments, a portable electronic device is provided, having the PLL circuit integrated therein, wherein: the portable electronic device is associated with stored data and comprises an active load modulation circuit configured to generate a response signal based on active load modulation of the generated clock signal in accordance with a near field communication (NFC) card emulation (CE) mode of operation According to another set of embodiments, a method is provided. The method includes: detecting whether a phase tracking signal is asserted by a phase detector of the PLL, the phase tracking signal indicating a detected phase difference between an output signal of the PLL and an input reference signal of the PLL; determining, automatically responsive to detecting that the phase tracking signal is asserted, whether a signal duration of the phase tracking signal exceeds a threshold duration; and forcing de-assertion of the phase tracking signal for a remainder of a present operating cycle of the PLL automatically responsive to determining that the signal duration exceeds the threshold duration.

According to another set of embodiments, a phase detector of a phase-locked loop (PLL) is provided. The phase detector includes: a reference edge detector to assert a first phase tracking signal responsive to detecting a start edge of a received clock reference signal; a feedback edge detector to assert a second phase tracking signal responsive to detecting start edge of a received feedback signal corresponding to an output clock signal generated by the PLL; feedback pause controller (FPC) block to assert a FPC signal responsive to detecting an end edge of the feedback signal subsequent to detecting assertion of a pause signal; and a reset network configured to assert a reset signal to reset the reference edge detector and the feedback edge detector responsive to detecting either assertion of both the first phase tracking signal and the second phase tracking signal, or assertion of the FPC signal.

According to another set of embodiments, a method is provided for feedback-pause-controlled phase detection in a phase-locked loop (PLL). The method includes: detecting an end edge of a feedback signal corresponding to an output clock signal generated by the PLL; updating a FPC signal automatically responsive to detecting the end edge of the feedback signal in accordance with a pause signal, such that the FPC signal is asserted responsive to the pause signal being asserted at the end edge of the feedback signal, and the FPC signal is de-asserted responsive to the pause signal being de-asserted at the end edge of the feedback signal; asserting a first phase tracking signal responsive to detecting a start edge of a clock reference signal only when the FPC signal is de-asserted; and asserting a second phase tracking signal responsive to detecting a start edge of the feedback signal only when the FPC signal is de-asserted.

According to another set of embodiments, a system is provided that includes a phase-locked loop (PLL) circuit having a PLL input node to receive a clock reference signal, a PLL output node to output a generated clock signal, and a phase detector, coupled with the PLL input node and the PLL output node to control a charge pump responsive to detecting a phase difference between the clock reference signal and a feedback signal corresponding to the generated clock signal. The phase detector includes: a reference edge detector to assert a first phase tracking signal responsive to detecting a start edge of the clock reference signal; a feedback edge detector to assert a second phase tracking signal responsive to detecting start edge of the feedback; and feedback pause controller (FPC) block to assert a FPC signal responsive to detecting an end edge of the feedback signal subsequent to detecting assertion of a pause signal.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Various types of short-range radiofrequency (RF) communications are becoming ubiquitous for a wide range of applications. For example, passive, contactless data devices are being used to authorize access to secure facilities, to effect electronic payment transactions at points of sale, to withdraw cash at automated teller machines, to quickly register and/or connect peripherals (e.g., headphones, printers, drives, etc.) to electronic devices, etc. Near-Field Communications (NFC) is one such RF communications technology that uses inductive coupling between devices to effect contactless exchange of data between devices over a short range (e.g., around 1.5 inches). Many NFC applications support passive NFC devices, such as a passive card or a passive tag. In such applications, the passive device includes one or more integrated chips and an integrated antenna, but no battery. When the passive device is being read by an active reader device, the reader sends a command transmission over an RF carrier (typically by amplitude shift key (ASK) modulation of the carrier signal). The RF carrier induces a current in the antenna of the passive device, which can be harvested by the passive device to power and clock its integrated chip(s). The activated chip(s) can then automatically respond by sending back a signal over the RF carrier, with the response signal being actively modulated according to data stored on the passive device. The reader can detect and process the response signal to recover the transmitted data.

Figure 1:
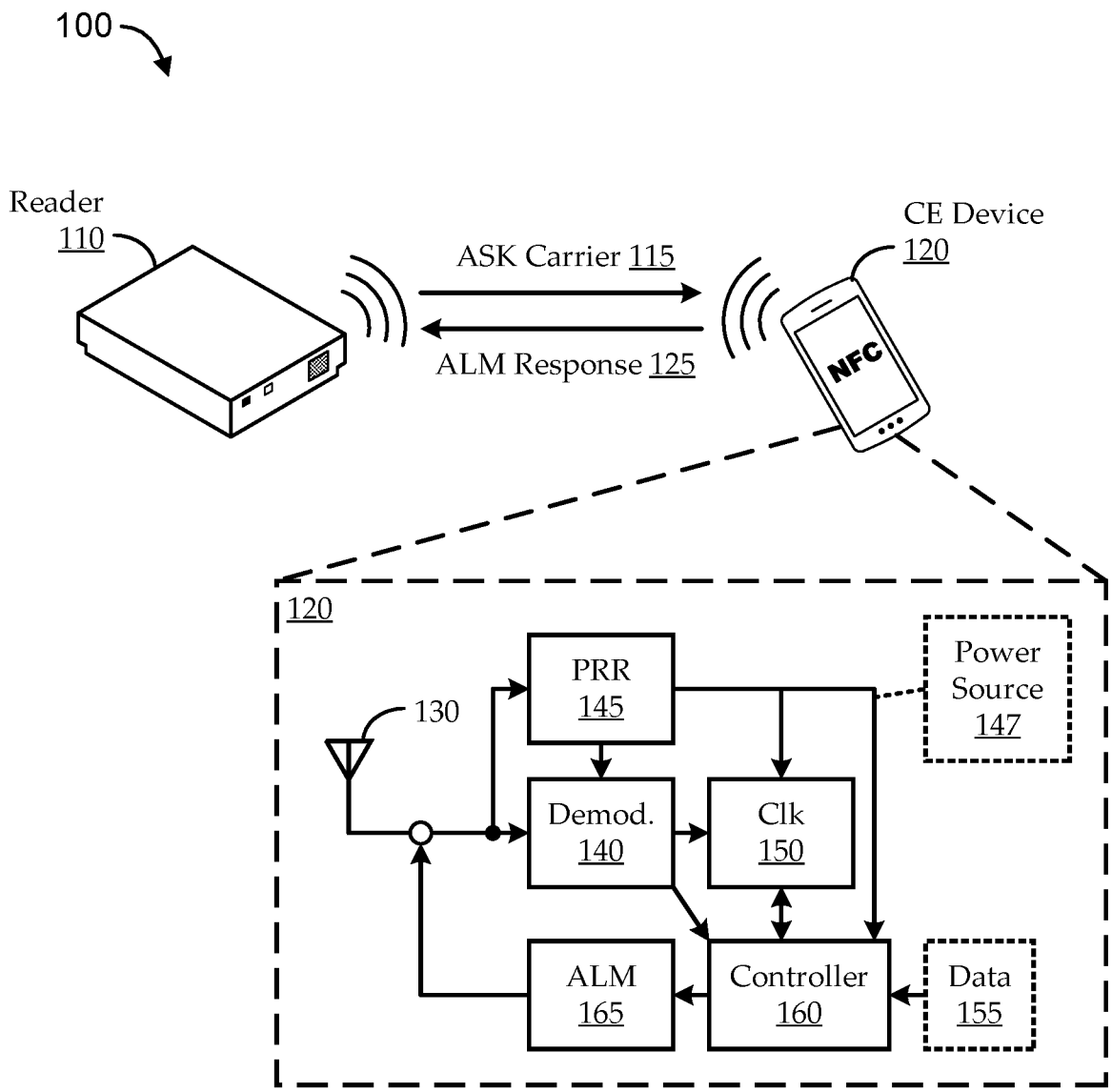
FIG. 1 shows an illustrative Near-Field Communications (NFC) transaction environment with a device operating in a so-called card emulation (CE) mode, as context for various embodiments described herein.

For the sake of illustration, FIG. 1 shows an illustrative Near-Field Communications (NFC) transaction environment with a device operating in a so-called card emulation (CE) mode, as context for various embodiments described herein. The CE device 120 can be a smart phone, wearable device (e.g., smart watch or fitness tracker), or any other suitable portable electronic device. In this context, the CE device 120 is typically an active device, but the CE device 120 is configured to operate in a mode in which it emulates a passive NFC device, such as a passive contactless card or tag. For example, a smart phone can be configured to support the NFC CE mode of operation, so that it can be used to effect mobile payment transactions, and the like, even while powered off, or in standby power mode.

As described above, a typical NFC transaction can involve the CE device 120 being read by a reader 110, such as an electronic lock, point of sale terminal, etc. The reader 110 can broadcast a signal over an ASK-modulated RF carrier 115, typically at 13.56 Megahertz. The RF carrier 115 induces a current in an antenna 130 of the CE device 120, and the antenna 130 can be configured specifically for NFC communications. As illustrated, antenna 130 of the CE device 120 can be coupled with one or more integrated circuits and/or data storage. In some implementations, some or all of the integrated circuits are dedicated circuits for implementing the NFC CE mode of operation, such as by including an integrated NFC (or NFC CE mode) chipset into a smart phone. In other implementations, some or all of the integrated circuits are implemented by multi-functional components of the CE device 120, such as by the main processors and/or other circuits of a smart phone. The integrated circuits can implement some or all of a demodulator module 140, a power regulator and/or recovery (PRR) module 145, a clock module 150, a controller module 160, and an active load modulation (ALM) module 165. The controller module 160 and/or other modules of the CE device 120 can include, or be implemented with, a central processing unit CPU, an application-specific integrated circuit (ASIC), an application-specific instruction-set processor (ASIP), a digital signal processor (DSP), a field-programmable gate array (FPGA), a programmable logic device (PLD), a controller, a microcontroller unit, a reduced instruction set (RISC) processor, a complex instruction set processor (CISC), a microprocessor, or the like, or any combination thereof. In some cases, data communicated by the CE device 120 in NFC CE mode is stored in on-board data storage 155 of the CE device 120, such as in a so-called secure element. In other cases, some or all of the data is stored off-board the CE device 120, such as in so-called Host Card Emulation (HCE) implementations, or the like.

In a typical operational example, the RF carrier 115 induces a current signal in the antenna 130 of the CE device 120. The energy from the current signal can be harvested and regulated by the PRR module 145 to power other component modules. In a typical NFC reader/writer mode with a passive device, there may be no power source at all, such that all the power for operation must be harvested from the received RF carrier 115. In NFC CE mode, the CE device 120 typically includes a power source 147, such as an integrated battery. However, it is desirable that, when operating in NFC CE mode, the CE device 120 draws minimal power from the integrated power source 147.

The current signal induced from the RF carrier 115 can also be demodulated by the demodulator module 140 and used by the clock module 150 to generate an internal clocking signal (or multiple clocking signals). As described herein, it is desirable for the internal clocking signal to track the RF carrier 115, so that the internal clocking signal can be used to generate a response transmission from the CE device 120 back to the reader 110. The internal clocking signal can also be used to clock other components, such as the controller module 160 and the ALM module 165. For example, the controller module 160 controls operation of one or more components of the system in NFC CE mode, while being powered at least partially by harvested power output by the PRR module, and while being clocked by the internal clocking signal output by the clock module 150. In such a manner, the controller module 160 can direct the ALM module 165 to actively modulate the internal clocking signal by switching a load (e.g., by switching a power amplifier on and off in the same frequency of the recovered clock) in accordance with particular data associated with the CE device 120. For example, the active load modulation of the internal clocking signal can be used to communicate identification codes, biometric data, image data, etc.

The output of the ALM module 165 is an ALM response signal 125 generate by the active load modulation of the internal clocking signal output. The generated ALM response signal 125 is used to drive the antenna 130, such that the antenna 130 broadcasts the ALM response signal 125 (e.g., at the same carrier frequency of 13.56 Megahertz) back to the reader 110. Thus, in a typical NFC CE mode transaction, the CE device 120 detects broadcast of the ASK-modulated RF carrier 115 signal from the reader 110 and automatically responds with a broadcast of the ALM response signal 125. The reader can detect and process the response ALM response signal 125 to recover the transmitted data, from which the reader 110 can make suitable determinations, such as whether to authorize access, to authorize a payment transaction, to effect a further data exchange, etc.

It is notable that the reader 110 and the CE device 120 rely on specific carrier frequencies for their communications, such that effective transacting may rely on the CE device 120 being able to generate and maintain a reliable internal clock signal that accurately tracks the received RF carrier 115. However, particularly in NFC CE mode, the RF carrier 115 tends not to provide a reliable clock reference for the CE device 120. For example, in NFC reader/writer mode, dedicated passive smart cards and/or smart tags are often implemented with relatively large antennas capable of receiving a relatively large signal level, and dedicated passive smart cards and/or smart tags typically use so-called passive load modulation (PLM) instead of ALM. However, CE devices 120 often include appreciably smaller antennas (e.g., antenna 130), which tend to receive an appreciably smaller signal level, and the coupling between the CE device 120 and reader 110 antenna tends to be weaker. As such, PLM tends not to be sufficient for reader 110 detection, and ALM tends to be used instead with such CE devices 120. To support such ALM, it can be desirable for the clock module 150 of a CE device 120 to include more complex clock circuits to assist with generating a stable and accurate internal clock signal from the received small-signal RF carrier 115, while drawing only minimal power from the power source 147. Embodiments of the clock module 150 include a phase-locked loop (PLL). PLLs operated by dynamically controlling loop state in an attempt to maintain tracking between their generated output and a received reference.

Figure 2A:
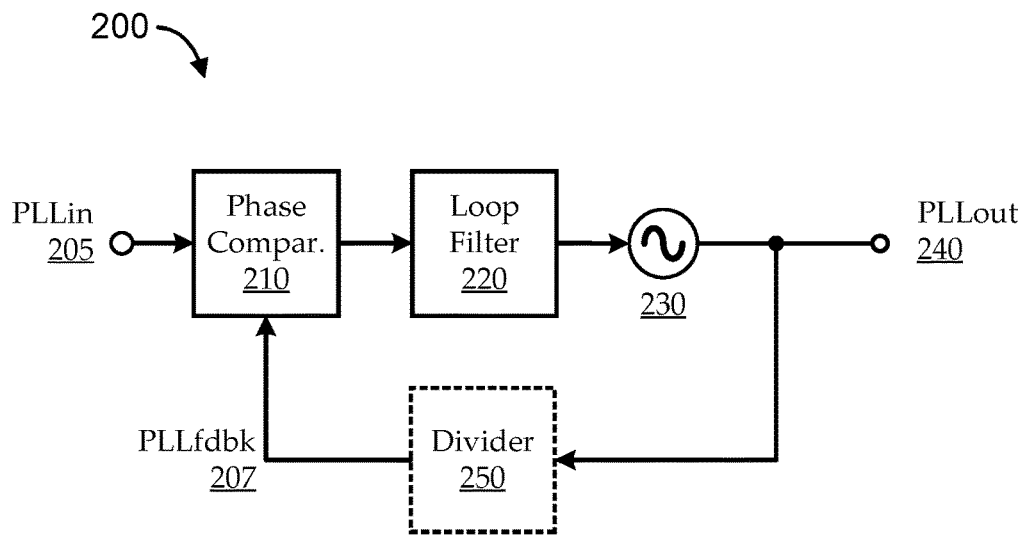
FIG. 2A shows an illustrative phase-locked-loop (PLL) circuit, as context for various embodiments.

For added context, FIG. 2A shows an illustrative phase-locked-loop (PLL) circuit 200. The PLL circuit 200 generates a PLL output signal (PLL_out) 240 in accordance with a received PLL input signal (PLL_in) 205. For example, PLL_in 205 can be a clock reference signal received from the RF carrier 115 at the NFC carrier frequency. The PLL circuit 200 uses a feedback loop to generate PLL_out 240 in an attempt to keep PLL_out 240 locked to a desired output frequency (e.g., the frequency of PLL_in 205, or a whole or fractional multiple of the input frequency of PLL_in 205). As illustrated, the PLL circuit 200 includes a phase comparison block 210, a loop filter block 220, a voltage controlled oscillator block 230. Some implementations also include a divider block 250.

The phase comparison block 210 can be implemented as a phase/frequency detector (PFD), or any other suitable component, that receives PLL_in 205 at an input reference frequency ($f_{REF}$) and compares PLL_in 205 with a signal fed back by the feedback loop of the PLL circuit 200. The fed back signal (PLL_fdbk 207) is at a feedback frequency ($f_{FDBK}$). The output of the phase comparison block 210 is a function of the comparison and is fed to the loop filter block 220. The loop filter block 220 can include any suitable components for facilitating filtering over the feedback loop, such as a charge pump and a low-pass filter. In some implementations, the charge pump is implemented as part of the phase comparison block 210 and used to drive the loop filter 220.

The output of the loop filter block 220 can be used as a control voltage for controlling the VCO block 230. The VCO block 230 can include any suitable oscillator, such as an inductive-capacitive (LC) oscillator, a ring oscillator, etc. The output frequency of the PLL circuit 200 (i.e., the frequency of PLL_out 240), or $f_{OUT}$, can therefore by controlled at least partially by the VCO block 230. In some implementations, PLL_out 240 is fed directly back to the phase comparison block 210 to complete the feedback loop of the PLL circuit 200. In other implementations, $f_{OUT}$ is further a function of a dividing value associated with a divider block 250. For example, if the divider block 250 is designed to divide $f_{OUT}$ by N (e.g., where N is a non-zero integer or real number), the PLL circuit 200 will seek to lock $f_{OUT}$ to a frequency that is N times $f_{REF}$ (the frequency of PLL_in 205). In that way, the dividing value associated with the divider block 250 can effectively define the mathematical relationship between the frequencies of PLL_out 240 and PLL_in 205, thereby effectively controlling $f_{OUT}$. Embodiments described herein generally assume that the PLL circuit 200 is configured to generate the PLL_out 240 to track the frequency and phase of the PLL_in 205 (i.e., that the generated internal clocking signal tracks the RF carrier 115). As such, the PLL circuit 200 of the clock module 150 of FIG. 1 may be implemented without a divider block 250, or with N=1.

Figure 2B:
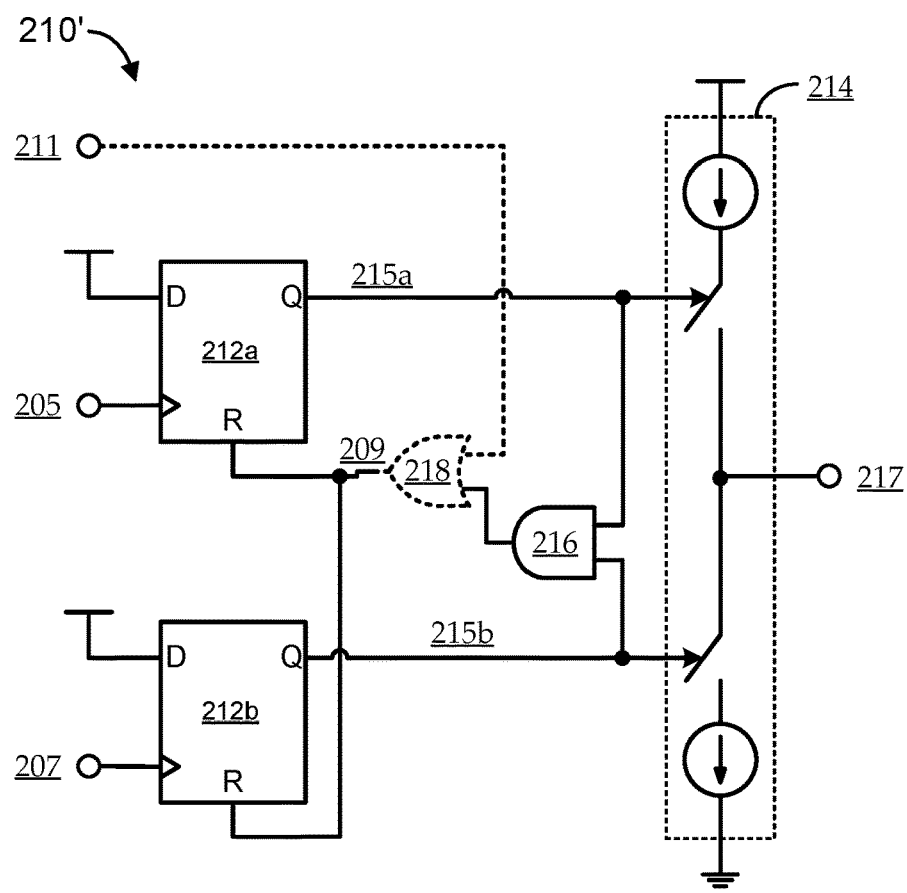
FIG. 2B shows an illustrative implementation of a conventional phase comparison block.

For further context, FIG. 2B shows an illustrative implementation of a conventional phase comparison block 210 (labeled as 210'). A first flip-flop 212a is configured as an edge detector for detecting a rising edge of PLL_in 205 (the clock reference signal), and a second flip-flop 212b is configured as an edge detector for detecting a rising edge of PLL_fdbk 207 (the loop feedback signal corresponding to the generated internal clocking signal). When the first flip-flop 212a is triggered, it outputs (and holds) a first phase tracking signal 215a (e.g., an "up" signal). When the second flip-flop 212b is triggered, it outputs (and holds) a second phase tracking signal 215b (e.g., a "down" signal). The first and second phase tracking signals 215 are coupled with a charge pump 214 that generated a loop filter current output 217. In particular, the first phase tracking signal 215a couples a first current source to the loop filter current output 217 that increases the amount of current being pumped to the loop filter, and the second phase tracking signal 215b couples a second current source to the loop filter current output 217 that decreases the amount of current being pumped to the loop filter. The phase tracking signals 215 are both coupled with an AND gate 216, which outputs a reset signal 209. As such, when both phase tracking signals 215 are asserted (i.e., rising edges are detected by both flip flops 212), the reset signal 209 is asserted, causing the flip-flops 212 to reset until the next PLL loop cycle.

As used herein, terms like "asserting" a signal, the signal is "asserted," are intended generally to indicate setting a signal to a logical value that indicates presence of a particular associated condition. In some embodiments, a signal is asserted by having a logical value of HIGH, TRUE, or '1', or the like; such as by holding the signal at a particular voltage level associated with that logical value. For example, each illustrated flip-flop 212 is illustrated as configured to assert a respective phase tracking signal 215 by switching the phase tracking signal 215 to a HIGH voltage level at its "Q" output responsive to detecting a rising edge of a triggering signal received at its input (i.e., either PLL_in 205 or PLL_fdbk 207). However, those of skill in the art will recognize that, with trivial variations to implementations illustrated and described herein, particular signals will be considered "asserted" when they are set to a logical LOW, FALSE, '0', or the like. For example, coupling each respective phase tracking signal 215 to a Q-bar output (complement of Q) of its associated flip flop 212, and adding a NOT gate in the path to the charge pump 214, results in an essentially equivalent circuit where the phase tracking signals 215 are "asserted" by setting their value to '0'.

In effect, if the phase of PLL_in 205 is left-shifted relative to (i.e., faster than that of) PLL_fdbk 207, the first flip-flop 212a will trigger first, thereby asserting the first phase tracking signal 215a (the "up" signal). While the first phase tracking signal 215a is asserted, more current is pumped into the loop filter 220 via charge pump 214 to compensate for the phase difference. When the PLL_fdbk 207 feedback edge is detected by the second flip-flop 212b, the second phase tracking signal 215b is momentarily asserted, causing the AND gate 216 to assert the reset signal 209, and resetting the flip-flops 212 (and de-asserting the phase tracking signals 215). As a corollary, if the phase of PLL_fdbk 207 is left-shifted relative to (i.e., faster than that of) PLL_in 205, the second flip-flop 212b will trigger first, thereby asserting the second phase tracking signal 215b (the "down" signal). While the second phase tracking signal 215b is asserted, current is reduced to the loop filter 220 via charge pump 214 to compensate for the phase difference. When the PLL_in 205 edge is detected by the first flip-flop 212a, the first phase tracking signal 215a is momentarily asserted, causing the AND gate 216 to assert the reset signal 209, and resetting the flip-flops 212 (and de-asserting the phase tracking signals 215).

As described above, PLL operation typically involves dynamic adjustment of loop state to maintain tracking of the output signal to the input reference. The described conventional phase tracking (e.g., according to FIG. 2B) tends to work well, as long as there is a stable clock reference at the input of the PLL by which to track. In the case of NFC CE mode, however, the input reference is typically the signal on the antenna 130, which can be unreliable. For example, when the CE device 120 is receiving, the signal on the antenna (the RF carrier 115) is being ASK-modulated, such that the clock reference for the PLL toggles unpredictably between being present and being absent (i.e., assuming typical 100-percent ASK modulation used by NFC readers). Similarly, when the CE device 120 is transmitting, the signal on the antenna (the ALM response signal 125) is being actively load-modulated, such that the amplitude of the signal changes in accordance with the data signal. If the PLL is used to track an unreliable clock reference, the output of the PLL will similarly be an unreliable output signal. For example, there could be large swings in phase and frequency error (relative to the desired carrier phase and frequency) during the times when the clock reference becomes unreliable, and as the PLL attempts to regain tracking when the reliable clock reference returns.

As such, some phase comparison blocks 210 are configured to selectively switch the PLL between open-loop and closed-loop modes based on the reliability of the clock reference. While the clock reference is reliable, it is desirable for the PLL to operate in the closed-loop mode, whereby the PLL output is tracked to the clock reference at its input by dynamically updating loop state. While the clock reference is unreliable, it is desirable for the PLL to operate in the open-loop mode, whereby the PLL output is not tracked to the clock reference at its input; instead maintaining its loop state in a last-updated condition. As illustrated, implementations can include a pause signal 211 that is asserted responsive to detecting the carrier being in an unreliable condition. In such implementations, the output of the AND gate 216 and the pause signal 211 can be inputs to an OR gate 218, which outputs the reset signal 209. For example, when the clock reference is unreliable, the pause signal 211 is asserted, thereby holding the flip-flops 212 in a reset state. There is no edge triggering, no assertion of the phase tracking signals 215, and no adjustment to the current supplied to the loop filter 220. As such, while the pause signal 211 is asserted, there is an effective de-coupling of the unreliable clock reference from loop state adjustments, and the PLL operates in an open-loop manner.

Once the clock reference is determined to be unreliable, asserting such a pause signal 211 can be an effective approach to triggering open-loop operation of the PLL. However, in some cases, it can be difficult to detect precisely when the clock reference becomes unreliable. For example, in the NFC CE mode, the controller module 160 of the CE device 120 can be used to detect the loss of a reliable reference signal and can assert the pause signal 211 as a control signal to the clock module 150. However, particularly while receiving the RF carrier 115 from the reader 110, there may be no way for the controller module 160 to know exactly when the ASK-modulated RF carrier 115 will suddenly disappear. Moreover, when the ASK modulation switches between HIGH and LOW, there is typically a period of time when there continues to be an induced signal in the antenna 130, but the signal effectively has a random phase; the reference is thus unreliable during that timeframe. For these and other reasons, there is typically a delay between the moment at which the clock reference becomes unreliable and the time when the PLL is triggered to operate in an open-loop manner. Even when that delay is relatively short, appreciable phase error can be introduced into the internal clocking signal. A similar effect can also occur when switching back to closed-loop operation. For example, there may be no way for the controller module 160 to know exactly when the ASK-modulated RF carrier 115 will suddenly reappear, and/or when the induced signal in the antenna 130 will settle back to a reliable clock reference. For these and other reasons, there is typically another delay between the moment at which the clock reference becomes reliable and the time when the PLL is triggered to operate in the closed-loop manner. Further, as described herein, when the PLL back is switched back to closed-loop mode, it can initially make incorrect tracking decisions, which can cause further delay until the PLL is accurately locked back onto the again-reliable clock reference.

In the NFC CE operating mode, successful operation can rely on accurate carrier tracking during all communication phases, including during a guard time phase, a frame delay time (FDT) phase, command reception phase, and an ALM phase. Some applications have associated operational constraints (e.g., specified by standards, or the like) for such carrier tracking. For example, a NFC CE mode application may be required to operate with a phase drift of less than a few degrees (e.g., less than five degrees), even when the command reception phase and/or ALM phase times are relatively long (e.g., appreciably longer than ten milliseconds). Such tracking can generally be straightforward during the guard time and frame delay time, where the RF carrier 115 tends to remain reliable. However, as described herein, such tracking becomes more difficult in the command reception phase due to the ASK modulation of the RF carrier 115, and in the ALM phase due to active load modulation of the ALM response signal 125. Further, based on the above, there are at least three timeframes of concern involved with maintaining accurate tracking of a desired carrier in context of an unreliable clock reference, such as during the command reception phase and the ALM phase. The first timeframe begins when the clock reference becomes unreliable and ends when the PLL enters open loop mode and stops tracking, during which time a conventional PLL would continue to track the unreliable clock reference. The second is the timeframe during which the PLL is running open loop, during which the PLL can tend to drift in frequency and/or phase. The third timeframe begins when the PLL is returned to closed mode and begins tracking to the clock reference and ends when the PLL successfully locks back onto the reference phase and frequency.

Some embodiments described herein seek to address concerns involved with the first timeframe. In a typical NFC CE implementation, such embodiments may tend to be most applicable to the command reception phase, when the ASK modulation of the RF carrier 115 causes the reliability of the carrier as a clock reference to be unpredictable. In contrast, during the ALM phase, the CE device 120 (e.g., the controller module 160 and/or the ALM module 165) typically controls when and how the carrier is modulated. As such, the CE device 120 can know exactly when the clock reference for the PLL will and will not be reliable, and can accurately control timing of when the PLL operates in open-loop and closed-loop modes. Such timing can be carefully controlled to substantially eliminate any delay between the clock reference becoming unreliable and the PLL entering open loop mode, thereby substantially eliminating effects of the first timeframe. Still, embodiments described herein can be applied to any suitable phase of any suitable communication environment in which a clock module 150 seeks to maintain tracking with an unpredictably unreliable clock reference.

Figure 3:
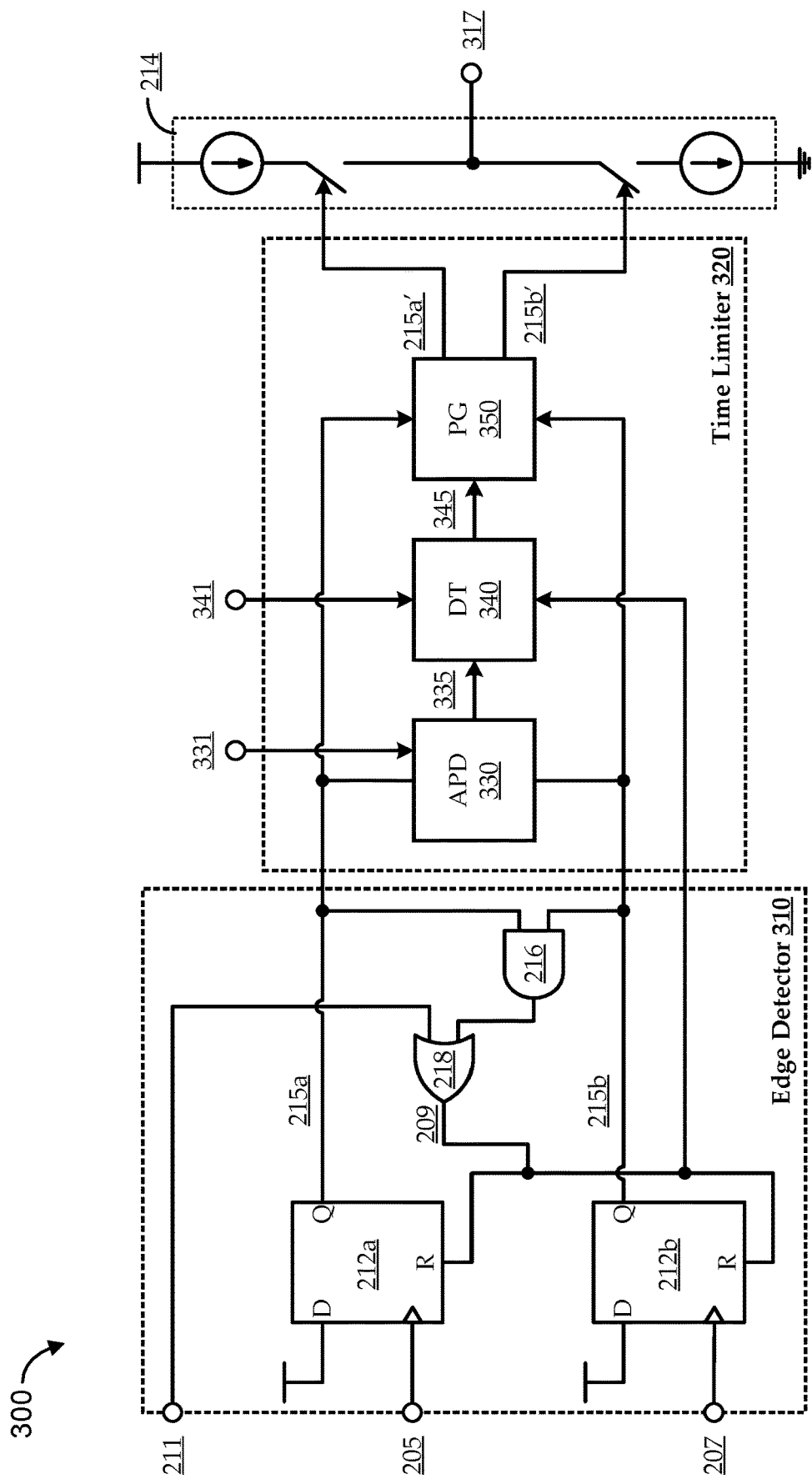
FIG. 3 shows an illustrative novel phase detector with integrated time limiting, according to various embodiments.

FIG. 3 shows an illustrative novel phase detector 300, according to various embodiments. The phase detector 300 can be an implementation of the phase comparison block 210 of the PLL circuit 200 of FIG. 2, which can be included in an implementation of the clock module 150 of the CE device 120 of FIG. 1. As illustrated, embodiments of the phase detector 300 include an edge detector 310, a time limiter 320, and a charge pump 214. In some embodiments, the edge detector 310 and the charge pump 214 include similar components to, and operate in a similar manner to, similarly labeled components of the phase comparison block 210' of FIG. 2B. As described above, the edge detector 310 can use flip-flops 212, or other suitable components, to detect an edge (e.g., a rising edge) of a PLL_in 205 signal (the clock reference signal) and a PLL_fdbk 207 signal (feedback from the internal clocking signal generated by the PLL). When the PLL_in 205 edge is detected, a first phase tracking signal 215a is asserted; when a PLL_fdbk 207 edge is detected, a second phase tracking signal 215b is asserted; and when both phase tracking signals 215 are asserted, a set of logic gates (AND gate 216 and OR gate 218) assert a reset signal to reset the flip flops 212 until the next loop iteration of the PLL. As illustrated, implementations can also include a pause signal 211, which can effectively stop the phase detector 300 from tracking to the clock reference, thereby setting the PLL to operate in an open-loop mode.

In the conventional implementation shown in FIG. 2B, the phase tracking signals 215 asserted by the flip-flops 212 directly control the charge pump 214. For example, assertion of the first phase tracking signal 215a corresponds to PLL_fdbk 207 lagging PLL_in 205, which directly causes a compensating increase in loop filter current at a charge pump output 317; and the second phase tracking signal 215b corresponds to PLL_fdbk 207 leading PLL_in 205, which directly causes a compensating decrease in loop filter current at a charge pump output 317. However, when the PLL is tracking an unreliable clock reference, this can result in appreciable phase and frequency error (e.g., until the pause signal 211 is ultimately asserted). In the novel phase detector 300 of FIG. 3, embodiments of the time limiter 320 can limit the impact of any phase tracking signal 215, thereby limiting the amount of phase and frequency error that can be introduced into the internal clocking signal in the event of the PLL tracking an unreliable clock reference.

As illustrated, the time limiter 320 can include an absolute phase detection (APD) sub-circuit 330, a delay timer sub-circuit 340, and a pulse gating sub-circuit 350. Embodiments of the APD sub-circuit 330 can detect whether a phase tracking signal 215 (one of the first or the second phase tracking signals 215) is asserted by the edge detector 310 in a present operating cycle of the PLL. As described herein, the phase tracking signal 215 indicates a detected phase difference between PLL_fdbk 207 and PLL_in 205. The APD sub-circuit 330 can output an absolute phase signal 335 responsive to detecting a phase difference between PLL_fdbk 207 and PLL_in 205 based on the phase tracking signal 215, such that the absolute phase signal 335 is asserted regardless of the direction of the phase difference (i.e., regardless of whether PLL_fdbk 207 is leading or lagging PLL_in 205). For example, the absolute phase signal 335 automatically goes HIGH whenever either of the phase tracking signals 215 is HIGH, and the absolute phase signal 335 automatically becomes de-asserted (returns to LOW) when there is a reset of the phase tracking signals 215.

Embodiments of the delay timer sub-circuit 340 are coupled with the APD sub-circuit 330 to determine whether a signal duration of an asserted phase tracking signal 215 exceeds a threshold duration. In some embodiments, the threshold duration is fixed, for example, by being hard-coded into circuitry of the delay timer sub-circuit 340. In other embodiments, the threshold duration is adjustable. The illustrated embodiment shows the delay timer sub-circuit 340 coupled with a control input node to receive a duration adjustment signal 341, and the duration adjustment signal 341 can effectively set the threshold duration. Such setting can be accomplished in any suitable manner. In one implementation, the duration adjustment signal 341 is hardware- or firmware-controlled, such as using switches, transistors, programmable firmware, etc. In another implementation, the duration adjustment signal 341 is dynamically controllable by software, by the controller module 160, etc. For example, a value associated with the duration adjustment signal 341 can be set in a software environment of the CE device 120, which thereby adjusts the threshold duration.

In some implementations, the APD sub-circuit 330 determines whether the signal duration exceeds the threshold duration based on the absolute phase signal 335. For example, when the absolute phase signal 335 is asserted, a delay time begins to record a duration during which the absolute phase signal 335 is asserted. If the delay timer sub-circuit 340 detects that the duration has reached or exceeded a threshold duration, the delay timer sub-circuit 340 can assert a gate trigger signal 345. As illustrated, embodiments of the delay timer sub-circuit 340 are coupled with the reset signal 209, so that the gate trigger signal 345 is effectively reset along with the phase tracking signals 215. Typically, the time-limiting functionality is in effect when the clock reference is unreliable, such as when the RF carrier is absent. At such times, there may be no edge of PLL_in 205 to detect, so that there may be no reset of the phase tracking signals 215 (e.g., until the clock reference becomes present again). In other cases, the RF carrier may not be absent; rather it may be otherwise unreliable (e.g., having indeterminate phase, etc.). In such cases, in each loop iteration of the PLL, the absolute phase signal 335 can be asserted from when a first rising edge is detected (i.e., of the faster of PLL_in 205 or PLL_fdbk 207 in that loop iteration) until a next rising edge is detected (i.e., of the slower of PLL_in 205 or PLL_fdbk 207 in that loop iteration), at which point a reset of the phase tracking signals 215 is triggered by the edge detector 310. Similarly, it can be seen that, in each loop iteration of the PLL, the gate trigger signal 345 may be asserted from when assertion of the absolute phase signal 335 first exceeds the threshold duration until the reset signal 209 is asserted for that loop iteration indicating a reset of the phase tracking signals 215.

Embodiments of the pulse gating sub-circuit 350 are coupled with the delay timer sub-circuit 340 to gate the duration of any phase tracking signal 215 that is asserted beyond the threshold duration controlled by the delay timer sub-circuit 340. In some embodiments, the pulse gating sub-circuit 350 forces de-assertion of any asserted phase tracking signal 215 until a next reset of the flip-flops 212 occurs (e.g., at least for a remainder of the present loop iteration of the PLL) automatically responsive to assertion of the gate trigger signal 345 by the delay timer sub-circuit 340. The output of the pulse gating sub-circuit 350 is a time-limited set of phase tracking signals 215, indicated as phase tracking signals 215'. The time-limited set of phase tracking signals 215' can be used to control the charge pump 214. In effect, each time-limited phase tracking signal 215' can be equal to a corresponding one of the phase tracking signals 215, but only as long as its duration does not exceed the threshold duration. For example, a first time-limited phase tracking signal 215a' is HIGH only when the corresponding first phase tracking signal 215a is HIGH and the gate trigger signal 345 is LOW; when the gate trigger signal 345 is HIGH, the first time-limited phase tracking signal 215a' is LOW, regardless of the state of the corresponding first phase tracking signal 215a.

In some embodiments, the time limiter 320 includes an enable input node to receive a time-limit enable signal 331. In the illustrated implementation, the time-limit enable signal 331 is coupled with the APD sub-circuit 330, which can effectively disable the time limiter 320. With such an implementation, when the time-limit enable signal 331 is de-asserted, the APD sub-circuit 330 is effectively disabled, such that there is no assertion of the absolute phase signal 335. As such, the absolute phase signal 335 cannot exceed the threshold duration, such that there will not be any assertion of the gate trigger signal 345, and the time-limited set of phase tracking signals 215 will always follow their corresponding phase tracking signals 215. Other implementations can use the time-limit enable signal 331 in any other suitable manner to provide for selective enabling and disabling of the time limiter 320. In one such implementation, the time-limit enable signal 331 is coupled with the delay timer sub-circuit 340 to hold the gate trigger signal 345 in a de-asserted state when the time-limit enable signal 331 is de-asserted.

Some implementations use the time-limit enable signal 331 to selectively disable the time limiter 320 during certain phases of operation. As noted above, a result of the time limiter 320 can be to limit the ability of the PLL to dynamically adjust in any one or more operating cycles, thereby minimizing the amount of phase and/or frequency drift that can occur while tracking an unreliable reference. However, in some phases of operation, limiting the PLL's ability to dynamically adjust can cause an undesirable slowing of the PLL functionality. For example, during startup of the PLL, or otherwise when the PLL is seeking to lock onto a clock reference, it can be desirable for such locking to occur as quickly as possible. Disabling the time limiter 320 during those phases can allow the PLL larger per-cycle dynamically adjustments, which can allow the PLL to more quickly lock onto the clock reference.

Figure 4:
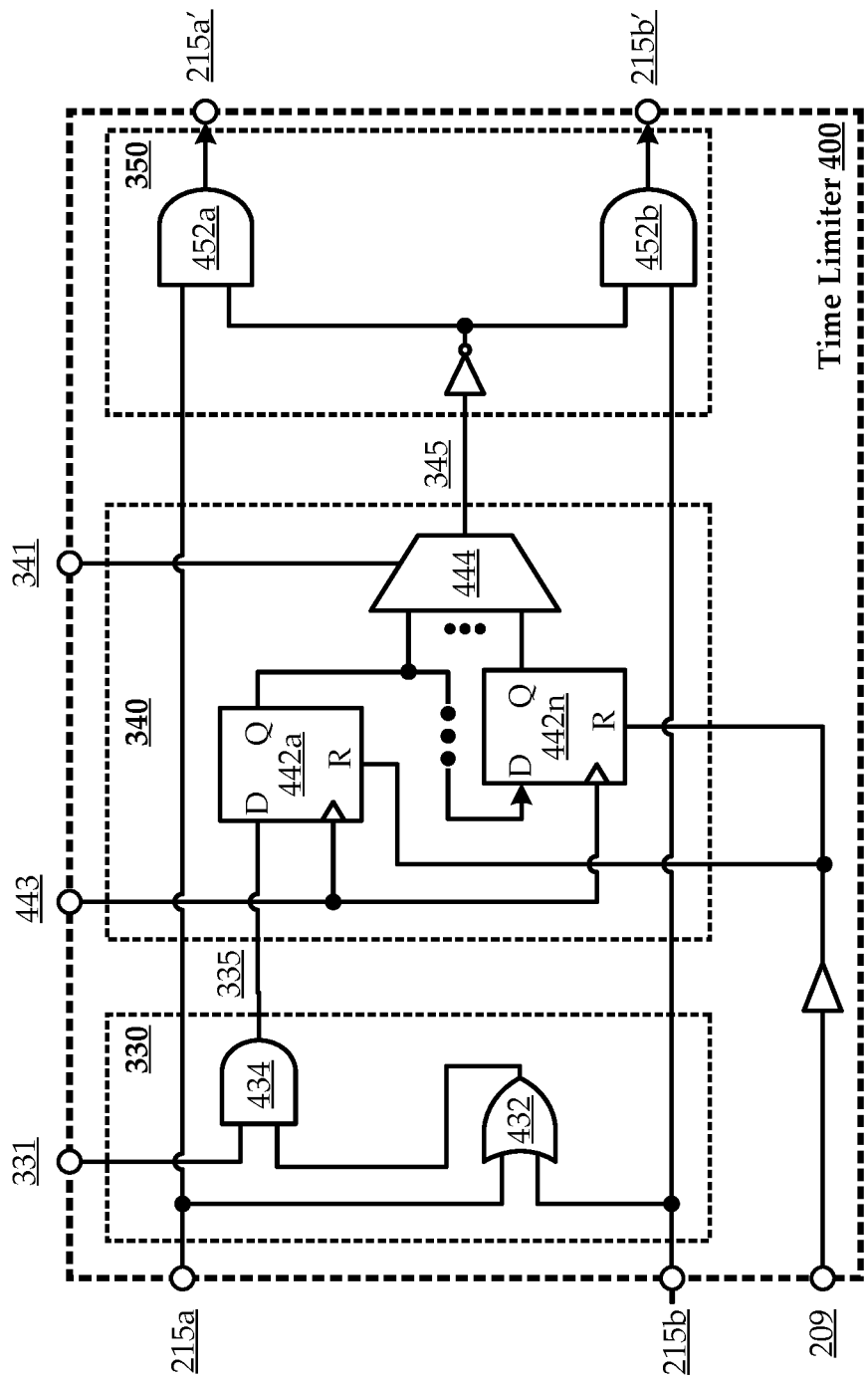
FIG. 4 shows an illustrative circuit implementation of a time limiter for integration in a phase comparison block of a clock module, according to various embodiments.

The time limiter 320 can be implemented using any suitable components in any suitable arrangement. FIG. 4 shows an illustrative circuit implementation of a time limiter 400 for integration in a phase comparison block of a clock module 150, according to various embodiments. For example, the time limiter 400 can be an implementation of the time limiter 320 in the phase detector 300 of FIG. 3. The illustrated time limiter 400 circuitry can be integrated in circuitry of other components, implemented as a dedicated integrated circuit, or implemented in any other suitable manner. As shown, the time limiter 400 can have input and/or output nodes for coupling components of the time limiter 400 with signal paths, such as signal paths of an edge detector 310 and a charge pump 214. As described with reference to FIG. 3, the time limiter 400 can include an APD sub-circuit 330, a delay timer sub-circuit 340, and a pulse gating sub-circuit 350.

The illustrated APD sub-circuit 330 includes an OR gate 432 having inputs coupled with the phase tracking signals 215, such that the OR gate 432 asserts its output when the first and/or second phase tracking signal 215 is asserted. As such, an asserted signal at the output of the OR gate 432 indicates that there is a phase difference between PLL_in 205 and PLL_fdbk 207. In some implementations, the output of the OR gate 432 is used as the absolute phase signal 335. In other implementations, the APD sub-circuit 330 further includes an AND gate 434 having inputs coupled with the output of the OR gate 432 and the time-limit enable signal 331, such that AND gate 434 asserts its output only when both the OR gate 432 output and the time-limit enable signal 331 are asserted. In such implementations, the output of the AND gate 434 is used as the absolute phase signal 335, such that the absolute phase signal 335 indicates that there is a phase difference between PLL_in 205 and PLL_fdbk 207 and time limiting is enabled.

The illustrated delay timer sub-circuit 340 can be coupled with the APD sub-circuit 330 via the absolute phase signal 335. As illustrated, the delay timer sub-circuit 340 can include a number of time delay elements, such as a multiple flip-flops 442 coupled together in a chain. The chain of flip-flops 442 can be clocked by any suitable delay timer clock signal 443 that is appreciably faster than the output frequency of the PLL (e.g., the carrier frequency). In operation, when the absolute phase signal 335 is asserted, it is clocked into the first of the chain of flip-flops 442; and assertion of the absolute phase signal 335 propagates through the chain of flip-flops 442, causing assertion of the output of each subsequent flip flop 442 in the chain with each cycle of the delay timer clock signal 443. The amount of time it takes for propagation through the entire chain of flip-flops 442 is a function of the number of flip-flops 442 in the chain and the frequency of the delay timer clock signal 443, which effectively sets the threshold duration (i.e., the chain of flip-flops 442 effectively implement a delay timer set with the threshold duration). If propagation continues through the entire chain of flip-flops 442 until the output of the last flip flop 442 in the chain is ultimately asserted, that output can be used to assert the gate trigger signal 345 as an indication that the full threshold duration has been reached. As illustrated, the chain of flip-flops 442 are coupled with the reset signal 209 (e.g., via a buffer). As such, if a reset occurs in the present operating cycle of the PLL, the flip-flops 442 reset, which effectively resets the delay timer. For example, in a particular operating cycle of the PLL, when either one of the phase tracking signals 215 is asserted, the absolute phase signal 335 can be asserted, and the asserted absolute phase signal 335 can start propagating through the chain of flip-flops 442. If the other phase tracking signal 215 is asserted before the propagation reaches the last flip-flop 442 in the chain, a reset is triggered, causing assertion of the reset signal 209 and resetting of the delay timer. However, if the other phase tracking signal 215 is not asserted before the propagation reaches the last flip-flop 442 in the chain, the output of the last flip-flop 442 in the chain will cause the gate trigger signal 345 to become asserted. The gate trigger signal 345 can remain asserted until a next reset of the flip-flops 212.

In some implementations, as illustrated, the delay timer sub-circuit 340 includes a selector component, such as a multiplexer 444. Inputs of the multiplexer 444 are coupled with respective outputs of some or all of the flip-flops 442 in the chain, and the output of the multiplexer 444 is a selected one of those inputs, as controlled by the duration adjustment signal 341. In the illustrated implementation, setting the duration adjustment signal 341 effectively controls the length of the chain of flip-flops 442 by selecting which flip-flop 442 output to use for asserting the gate trigger signal 345. Any suitable number of delay components can be included in the chain, depending on the desired range of threshold delays, how finely it is desired to tune the threshold delay, and/or other factors. In some implementations, the multiplexer 444 output is used directly as the gate trigger signal 345.

The illustrated pulse gating sub-circuit 350 is coupled with the delay timer sub-circuit 340 via the gate trigger signal 345. As shown, the pulse gating sub-circuit 350 can include an inverter and a pair of AND gates 452. Each AND gate 452 can generate a respective one of the time-limited set of phase tracking signals 215' at its output, responsive to one input being coupled with the complement of the gate trigger signal 345, and another input being coupled with a respective one of the phase tracking signals 215. In such a configuration, each time-limited phase tracking signal 215' is asserted when the corresponding phase tracking signal 215 is asserted and the gate trigger signal 345 is not asserted. For example, each time-limited phase tracking signal 215' is equal to its corresponding phase tracking signal 215, but only as long as its duration does not exceed the threshold duration. When the threshold duration is exceeded, the gate trigger signal 345 forces de-assertion of any asserted time-limited phase tracking signal 215', regardless of whether its corresponding phase tracking signal 215 is asserted.

Figure 5:
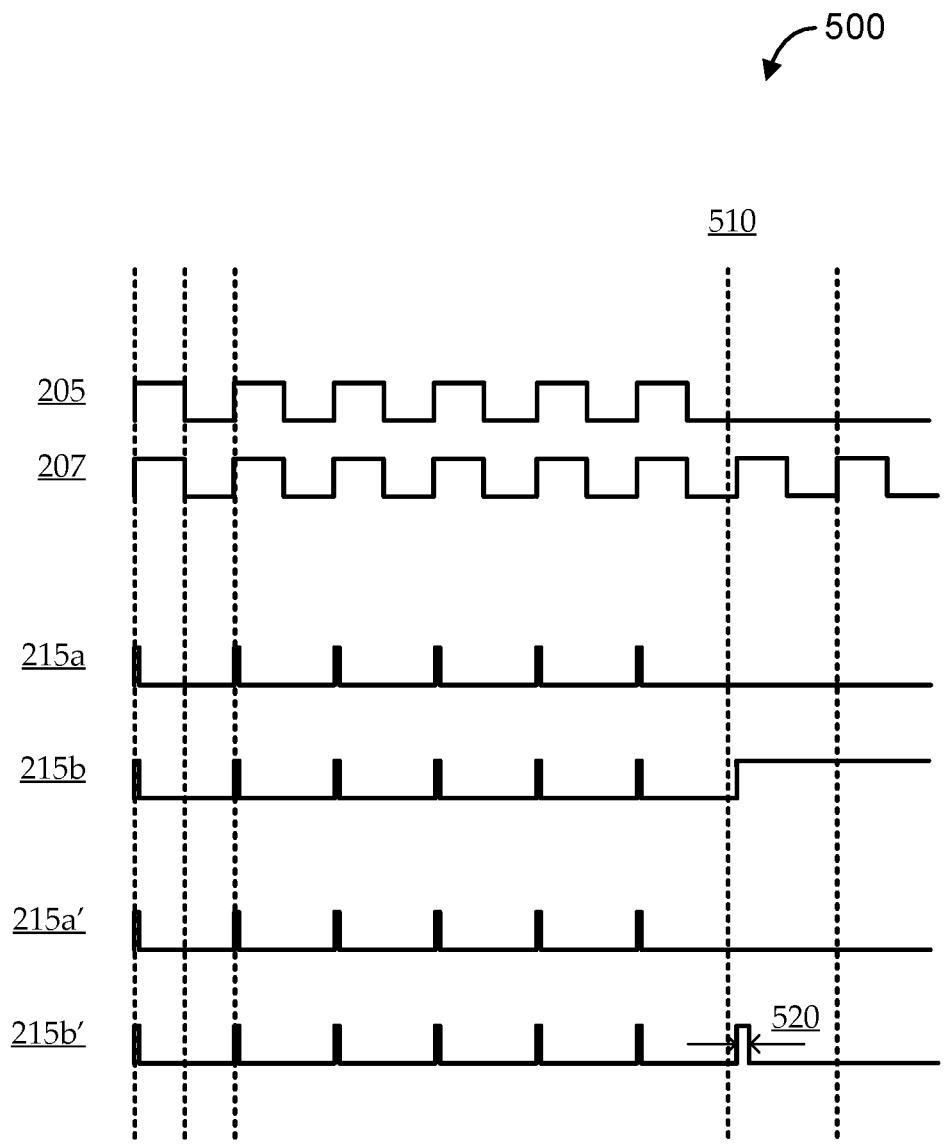
FIGS. 5 and 6, which show illustrative plots of various signals of a phase detector having a novel time limiter, as described herein.
Figure 6:
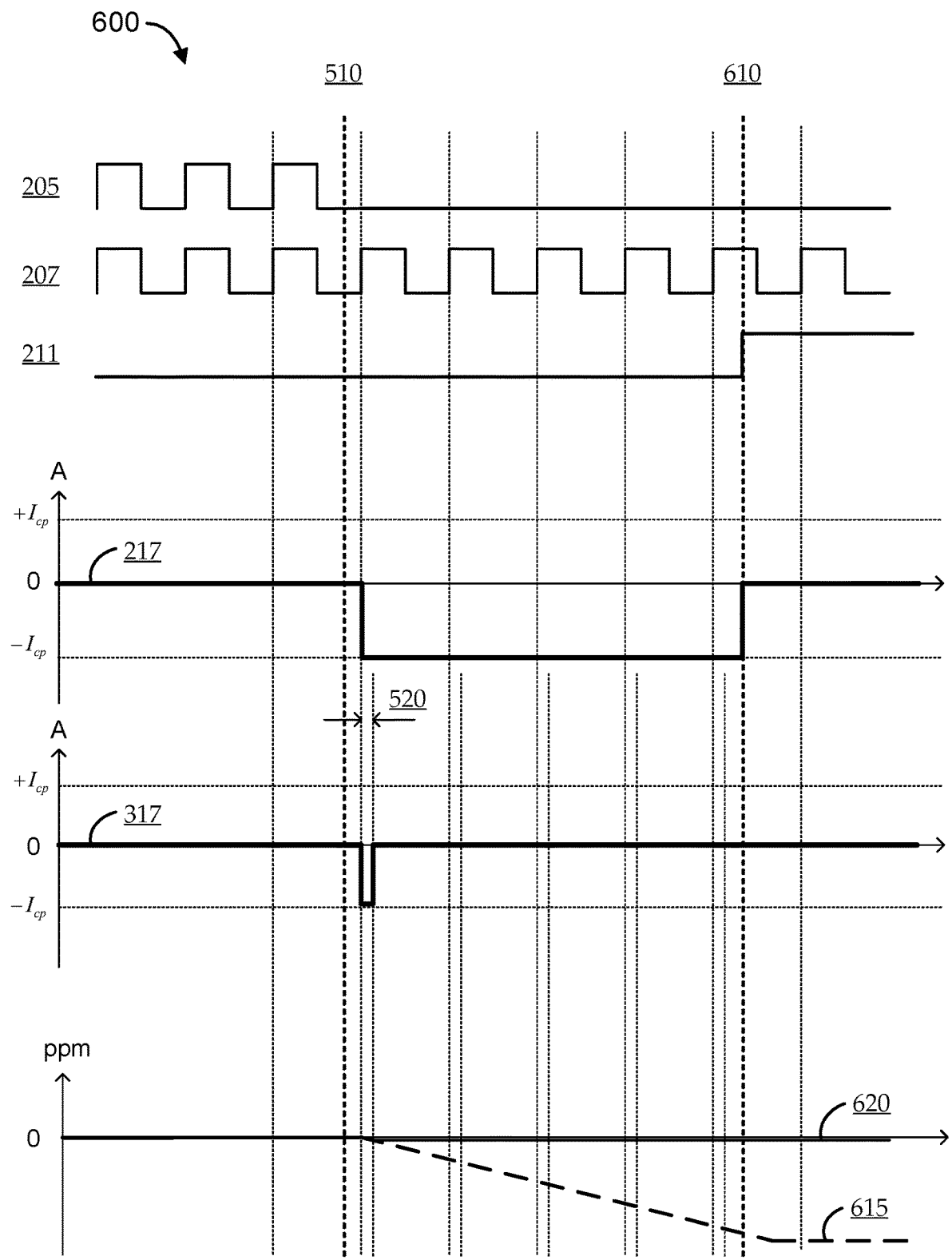

Such time-limiting of the phase tracking signals 215 can be seen in FIGS. 5 and 6, which show illustrative plots 500 and 600 of various signals of a phase detector having a novel time limiter, as described herein. Turning first to FIG. 5, the plots 500 begin in a timeframe when steady state has been reached, such that the clock reference is reliable, and the PLL has locked onto and is accurately tracking the clock reference. For example, the clock reference at PLL_in 205 is faithfully represented by PLL_fdbk 207, corresponding to feedback of the PLLout 240 signal. In such a steady state condition, at each rising edge of PLLin 205 and PLL_fdbk 207, the edge detector 310 may briefly assert the first phase tracking signal 215a and the second phase tracking signal 215b prior to triggering a reset. At the output of the time limiter 320, the time-limited phase tracking signals 215' may be substantially equivalent to their corresponding phase tracking signals 215, as the durations are well within the threshold duration.

At some time 510, the clock reference becomes unreliable (e.g., illustrated as immediately disappearing). It can be seen that, after this occurs, the next rising edge is necessarily from the PLL_fdbk 207 signal, which triggers assertion of the second phase tracking signal 215b. This is effectively a "down" signal, indicating to the PLL that its output is too fast, and compensation is need to slow the PLL output. Because the PLLin 205 has disappeared, no edge is detected for PLLin 205 in the operating cycle, and no signal is available to trigger a reset. As such, the second phase tracking signal 215b remains asserted. Without the time limiter 320, the second phase tracking signal 215b may remain asserted until the pause signal 211 is detected. Meanwhile, the PLL will continue to attempt tracking of the unavailable clock reference, repeatedly making an improper compensation determination.

However, this effect can be mitigated by the time limiter 320. As shown, embodiments of the time limiter 320 may still assert the second time-limited phase tracking signal 215b' (corresponding to the second phase tracking signal 215b) in response to detecting the rising edge of PLL_fdbk 207 subsequent to time 510. However, as soon as the duration of the asserted second time-limited phase tracking signal 215b' reaches the threshold duration (illustrated as reference 520), the time limiter 320 forces de-assertion and resetting of the delay timer. As noted above, with no rising edge of PLL_in 205 after time 510 to trigger a reset of the phase tracking signals 215, the second phase tracking signal 215b remains asserted. However, because of the time-limiting, the second time-limited phase tracking signal 215b' only remains asserted for the threshold duration 520, thereby limiting the impact of the incorrect compensation decision. Even if some unreliable artifact in PLL_in 205 causes a reset of the phase tracking signals 215, the time-limiting still limits assertion of the phase tracking signals 215' to a small portion of each operating cycle of the PLL, thereby limiting the impact of the incorrect compensation decision in each operating cycle.

Turning to FIG. 6, the plots 600 illustrate an extension of the timeframe illustrated in FIG. 5. Again, the PLLin 205 plot shows the clock reference becoming absent at some time 510. After additional time elapses, the absence of the clock reference is ultimately detected, and the pause signal 211 is asserted at time 610. Without the time limiter 320, the resulting charge pump current output (e.g., the charge pump current 217 shown in the illustrative conventional implementation of FIG. 2B) may be controlled directly by the phase tracking signal 215. As such, upon detection of the next rising edge after time 510 (from the PLL_fdbk 207 signal), the second phase tracking signal 215b is asserted (as shown in FIG. 5), causing the charge pump current 217 to drop to a negative level (−I_cp). Without time limiting, the charge pump current 217 continues to be held at the negative level until the pause signal is asserted 211, thereby forcing a reset.

With the time limiter 320, the charge pump current is controlled instead by the time-limited phase tracking signals 215', as with charge pump current 317 of FIG. 3. As shown, embodiments of the time limiter 320 may still assert the second time-limited phase tracking signal 215b' (corresponding to the second phase tracking signal 215b) in response to detecting the rising edge of PLL_fdbk 207 subsequent to time 510, triggering a corresponding switching of the charge pump current 317 to the negative level (−I_cp). However, as soon as the duration of the asserted second time-limited phase tracking signal 215b' reaches the threshold duration (illustrated as reference 520), the time limiter 320 forces de-assertion and resetting of the delay timer, returning the charge pump current 317 to zero.

The bottom-most graph of FIG. 6 shows two plots of relative frequency error between PLL_fdbk 207 and PLLin 205. The first relative frequency error plot 615 corresponds to the plot of charge pump current 217 without a time limiter 320. It can be seen that, in the timeframe between time 510 and time 610, the magnitude of frequency error rapidly and continuously increases (i.e., moves away from zero). The second relative frequency error plot 620 corresponds to the plot of charge pump current 317 with a time limiter 320. It can be seen that, in the timeframe between time 510 and time 610, the magnitude of frequency error still increases, but only slightly. In particular, the magnitude of frequency error primarily changes only during the small window when the time-limited phase tracking signal 215' is asserted, corresponding to the threshold duration. As such, integrating the time limiter 320 in a PLL can facilitate a number of features, such as supporting a wider PLL loop bandwidth, shorter PLL start-up time, reduced loop filter area, etc.

Figure 7:
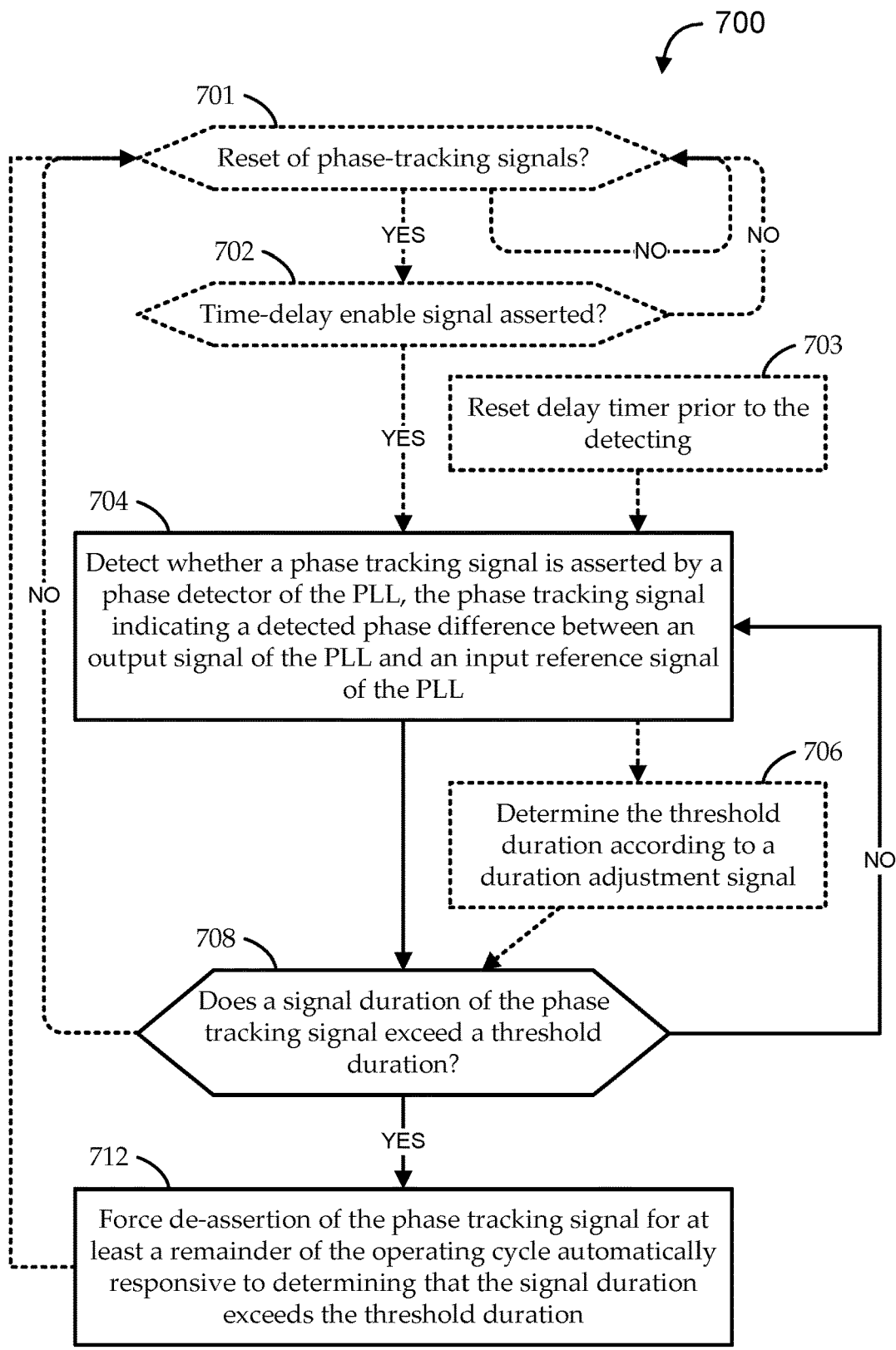
FIG. 7 shows a flow diagram of an illustrative method for time-limited carrier phase tracking in a phase detector of a clock circuit, according to various embodiments.

FIG. 7 shows a flow diagram of an illustrative method 700 for time-limited carrier phase tracking in a phase detector of a clock circuit, according to various embodiments. In some embodiments, some or all steps of the method 700 are performed iteratively for each operating cycle of the clock circuit (e.g., a PLL). In other embodiments, some or all steps of the method 700 are performed only after resetting of the phase tracking signals. For example, some such embodiments 700 can begin at stage 701 by determining whether the phase tracking signals have been reset (e.g., by assertion of a reset signal that resets edge triggering flip-flops of the phase detector). In such embodiments, some or all other steps of the method 700 are performed only after such a reset occurs, and the method 700 continues to wait for such a reset otherwise. In other embodiments, some or all steps of the method 700 are performed iteratively for each operating cycle of the clock circuit only where the method is enabled. For example, some such embodiments 700 can begin at stage 702 by determining whether a time-limit enable signal (e.g., time-limit enable signal 331) is asserted, and performing some or all other steps of the method 700 only when the time-limit enable signal is asserted.

Some embodiments of the method 700 begin at stage 704 by detecting whether a phase tracking signal (e.g., the first and/or second phase tracking signal 215) is asserted (e.g., for the operating cycle) by a phase detector. The phase tracking signal indicates a detected phase difference between an output signal of the PLL (e.g., PLL_fdbk 207) and an input reference signal of the PLL (e.g., PLLin 205). At stage 708, embodiments can determine, automatically responsive to detecting that the phase tracking signal is asserted, whether a signal duration of the phase tracking signal exceeds a threshold duration. If not, embodiments can return to an appropriate stage of the method 700 (e.g., waiting for a reset in anticipation of the next operating cycle by returning to stage 701, continuing to detect whether the signal duration has exceeded the threshold duration at stage 704, etc.).

If the signal duration of the phase tracking signal is detected to exceed the threshold duration in stage 708, embodiments can force de-assertion of the phase tracking signal at stage 712 (e.g., for a remainder of the operating cycle and/or until a reset occurs). For example, the detection in stage 708 of the signal duration of the phase tracking signal exceeding the threshold duration can cause assertion of a gate trigger signal 345, which can be used to gate the phase tracking signals 215. In accordance with such gating, the method 700 can ensure that the phase tracking signal 215 do not remain asserted beyond the threshold duration. In some embodiments, at stage 706, the method 700 can include determining the threshold duration according to a duration adjustment signal. In such embodiments, the threshold duration is adjustable by the duration adjustment signal. In some embodiments, prior to the detecting in stage 704, the method 700 can reset a delay timer. In such embodiments, the delay time can be set with the threshold duration and can facilitate the determination in stage 708. In some cases, while waiting to determine whether the signal duration of the phase tracking signal is detected to exceed the threshold duration in stage 708, the phase tracking signal may otherwise become de-asserted. Embodiments can effectively treat such cases as a determination at stage 708 that the signal duration of the phase tracking signal did not exceed the threshold duration.

Feedback-Pause-Control for Rapid Clock Re-Acquisition

As noted above, successful implementation of an NFC CE operating mode, or the like, can rely on accurate carrier tracking during all communication phases, including during a guard time phase, a frame delay time (FDT) phase, command reception phase, and an ALM phase. Particularly during the command reception phase (where the RF carrier is ASK-modulated), and in the ALM phase (where there is active load modulation of the response signal), there are multiple timeframes of concern involved with maintaining accurate tracking of a desired carrier. A first such timeframe begins when the clock reference becomes unreliable and ends when the PLL enters open loop mode and stops tracking, during which time a conventional PLL would continue to track the unreliable clock reference. Embodiments described above can seek to address concerns during this first such timeframe, for example, by time-limiting the impact of incorrect compensation decisions made in each operating cycle of the PLL.

A second such timeframe begins when the PLL is returned to closed-loop operation to begin re-acquisition of the clock reference and ends when the PLL successfully locks back onto the reference phase and frequency. Feedback-based pause-controlling (FPC) approaches described herein can seek to address concerns relating to this second such timeframe. For example, when the PLL loop is first closed, it will conventionally begin to make normal tracking and compensation decisions, which can be based on whichever edge is first detected. Depending on the time of closing the PLL loop relative to the edge timing of the RF carrier (PLL_in 205) and the PLL output signal (PLL_fdbk 207), the PLL can initially make an incorrect compensation decision. For example, PLL_in 205 may be lagging PLL_fdbk 207 in phase, but the rising edge of PLL_in 205 is nevertheless the first edge to be detected after the PLL loop is closed. It may take a large number of cycles for the incorrect decision to be naturally detected by the PLL (when the incorrectly compensated PLL_fdbk 207 is pushed far enough out of phase relative to PLL_in 205 that the PLL is forced to begin making the opposite, correct, compensation determination), and for the PLL to adapt accordingly. In the meantime, an appreciable amount of phase and frequency error can be introduced, as well as a large associated delay until the PLL successfully locks back onto the reference phase and frequency.

Figure 13:
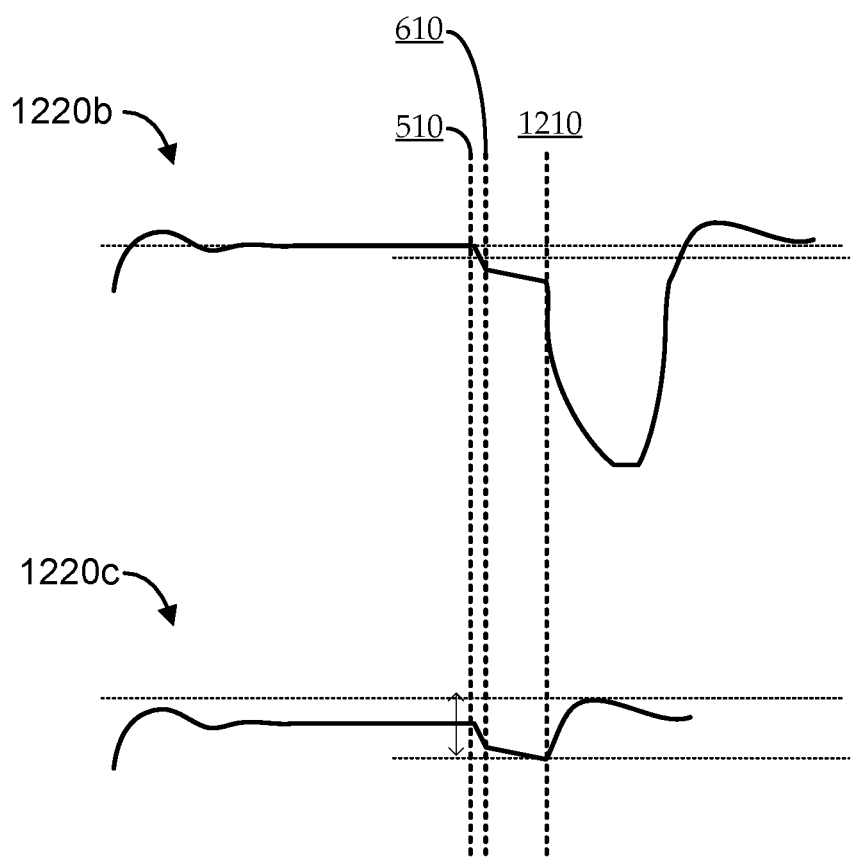
FIG. 13, which shows illustrative plots 1220 of relative phase error 1220 between PLL_fdbk 207 and PLLin 205 according to non-PFC-aided and PFC-aided scenarios.

An example of such an effect can be seen in FIG. 13, which is described in more detail below. The upper frequency error plot 1220b of FIG. 13 can represent an example of the PLL making an incorrect initial compensation determination at time 1210 (e.g., when the PLL loop closes). It can be seen that the frequency error in that case moves far away from zero and takes a significant time to correct and settle within a suitable frequency error margin. In contrast, the lower frequency error plot 1220c of FIG. 13 can represent an example of the PLL making a correct initial compensation determination at time 1210. It can be seen that the frequency error in that case moves initially in the correct direction (toward zero), such that it takes a relatively short time to settle within a suitable frequency error margin. For example, an "incorrect initial compensation determination" is one that initially increases the discrepancy between PLL_in 205 and PLL_fdbk 207, and a "correct initial compensation determination" is one that initially decreases the discrepancy between PLL_in 205 and PLL_fdbk 207.

Figure 8:
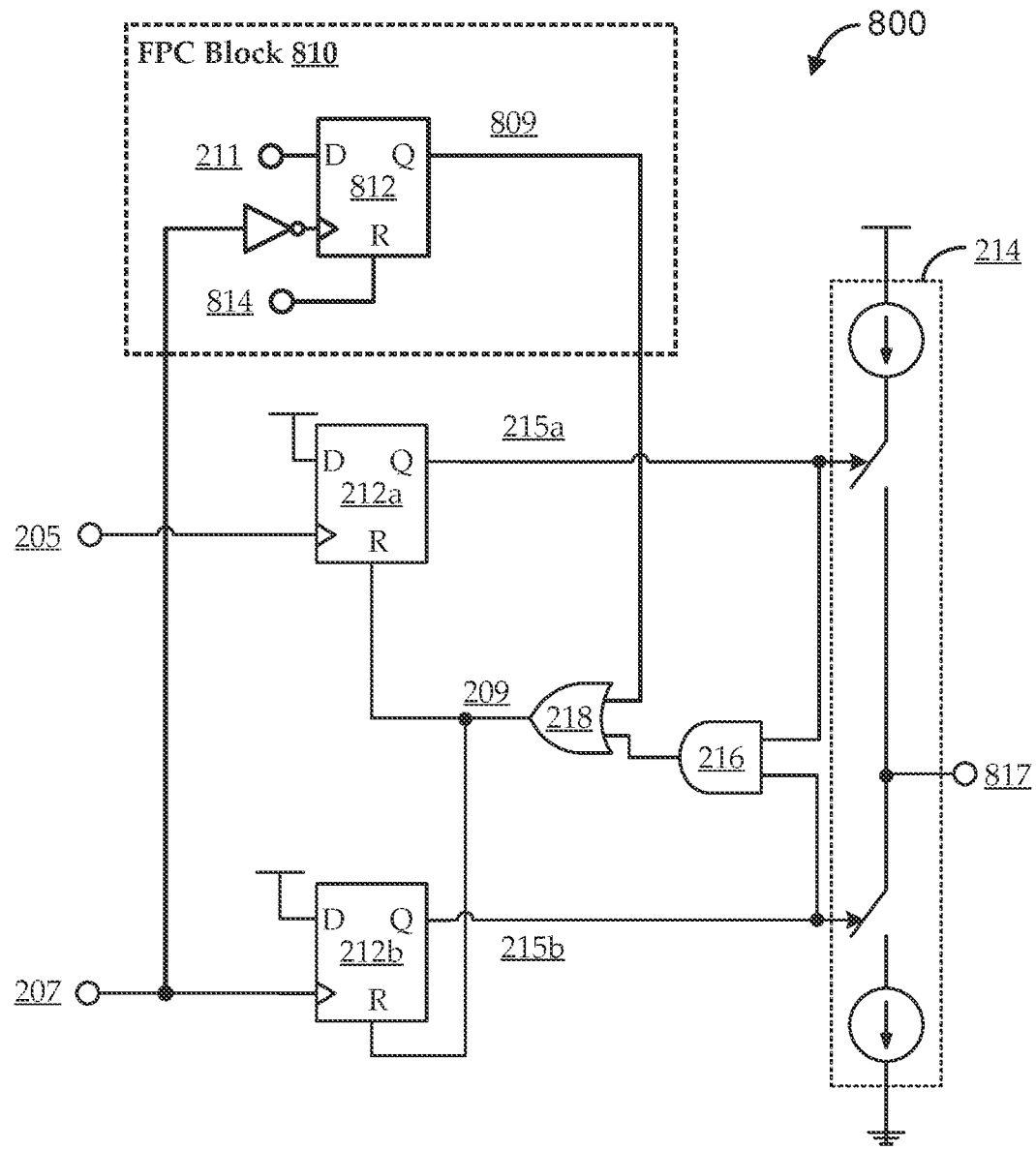
FIG. 8 shows an illustrative feedback-pause-controlled phase detector circuit 800, according to various embodiments.

Embodiments can force the correct initial decision by tying the loop-closing effect of the pause signal to edge detection of PLL_fdbk 207. FIG. 8 shows an illustrative feedback-pause-controlled phase detector circuit 800, according to various embodiments. The phase detector circuit 800 can be an implementation of a phase comparison block of a PLL, such as the phase comparison block 210 of FIG. 2A. As illustrated, the a first flip-flop 212a is configured as an edge detector for detecting a rising edge of PLL_in 205 (the clock reference signal), and a second flip-flop 212b is configured as an edge detector for detecting a rising edge of PLL_fdbk 207 (the loop feedback signal corresponding to the generated internal clocking signal). When the first flip-flop 212a is triggered, it outputs (and holds) a first phase tracking signal 215a (e.g., an "up" signal). When the second flip-flop 212b is triggered, it outputs (and holds) a second phase tracking signal 215b (e.g., a "down" signal).

The first and second phase tracking signals 215 are coupled with a charge pump 214 that generated a loop filter current output 217. In particular, the first phase tracking signal 215a couples a first current source to the loop filter current output 217 that increases the amount of current being pumped to the loop filter, and the second phase tracking signal 215b couples a second current source to the loop filter current output 217 that decreases the amount of current being pumped to the loop filter. In effect, if the phase of PLL_in 205 is left-shifted relative to (i.e., faster than that of) PLL_fdbk 207, the first flip-flop 212a will trigger first. As such, the first flip-flop 212a asserts the first phase tracking signal 215a, causing more current to be pumped into the loop filter 220 via charge pump 214, and causing the PLL to speed up PLL_fdbk 207. If, instead, the phase of PLL_in 205 is right-shifted relative to (i.e., slower than that of) PLL_fdbk 207, the second flip-flop 212b will trigger first. As such, the second flip-flop 212b asserts the second phase tracking signal 215b, causing less current to be pumped into the loop filter 220 via charge pump 214, and causing the PLL to slow down PLL_fdbk 207.

The phase tracking signals 215 are both coupled with an AND gate 216, which outputs a reset signal 209. As such, when both phase tracking signals 215 are asserted (i.e., rising edges are detected by both flip flops 212), the reset signal 209 is asserted, causing the flip-flops 212 to reset until the next PLL loop cycle. Embodiments can also hold the reset signal 209 in an asserted state (i.e., the flip-flops 212 can be held in reset) using a pause signal. Conventional implementations of such a pause signal (e.g., pause signal 211 of FIG. 2B) tend to be controlled separate from the phase detection circuitry. For example, other component functionality of a controller (e.g., ASIC) can detect when the RF carrier appears to be present or absent and can assert or de-assert the pause signal, accordingly.

As illustrated in FIG. 8, embodiments described herein can force resetting of the flip-flops 212 based on a feedback-pause-control (FPC) signal 809. The FPC signal 809 is partially controlled automatically by a FPC block 810 based on internal signaling of the phase detector circuit 800. Embodiments of the FPC block 810 include a flip-flop 812. A reset input node of the flip-flop 812 can be coupled with a global reset signal 814. A data input (D) of the flip-flop 812 can be coupled with an externally controlled pause signal, such as pause signal 211. For example, the externally controlled pause signal is asserted when a controller external to the phase detector 800 determines that the clock reference (e.g., the RF carrier) is unreliable, and is de-asserted when the controller external to the phase detector 800 determines that the clock reference has returned to being reliable. As another example, the pause signal 211 can be asserted during ALM (e.g., while the ALM block 165 is being used to drive the CE device antenna 130), and can be de-asserted when ALM stops (e.g., when the ALM block 165 is no longer being used to drive the CE device antenna 130).

As shown, the output node is coupled with the FPC signal 809, and the clocking input node is coupled with the complement of PLL_fdbk 207 (e.g., coupled with PLL_fdbk 207 via an inverter). With the FPC signal 809 at the output of the flip-flop 812, and the externally controlled pause signal at the data input of the flip-flop 812, the FPC signal 809 generally tracks the externally controlled pause signal. However, any change in the state of the externally controlled pause signal is only propagates to the output of the flip-flop 812 when the clock input node is triggered, which occurs at a next falling edge of PLL_fdbk 207. For example, suppose the externally controlled pause signal has been asserted, such that the FPC signal 809 has been similarly asserted; the phase detector 800 is effectively disabled, placing the PLL in an open loop configuration. At some point, the externally controlled pause signal is de-asserted, indicating detection of the clock reference returning to a reliable state for tracking. Without the FPC block 810, this change in state of the pause signal may directly de-assert resetting of flip-flops 212, thereby directly returning the PLL to closed-loop mode. However, with the FPC block 810, the de-assertion of the externally controlled pause signal is not reflected on the FPC signal 809 (and the phase detector 800 is not re-enabled, returning the PLL to the closed-loop mode) until the next falling edge of PLL_fdbk 207.

Figure 9A:
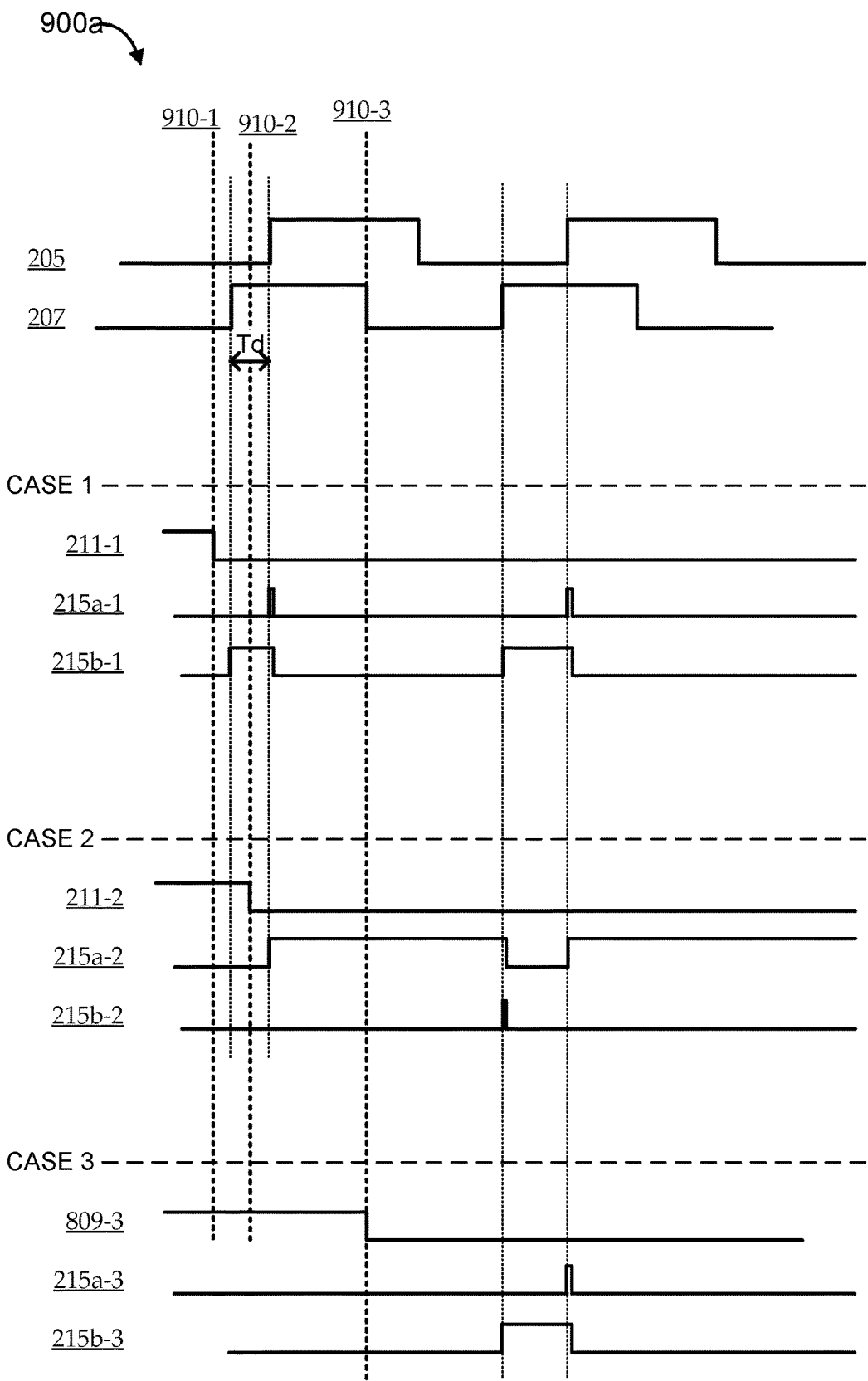
FIGS. 9A and 9B show example plots 900 to illustrate certain features associated with the feedback-pause-controlled implementations, according to various embodiments.
Figure 9B:
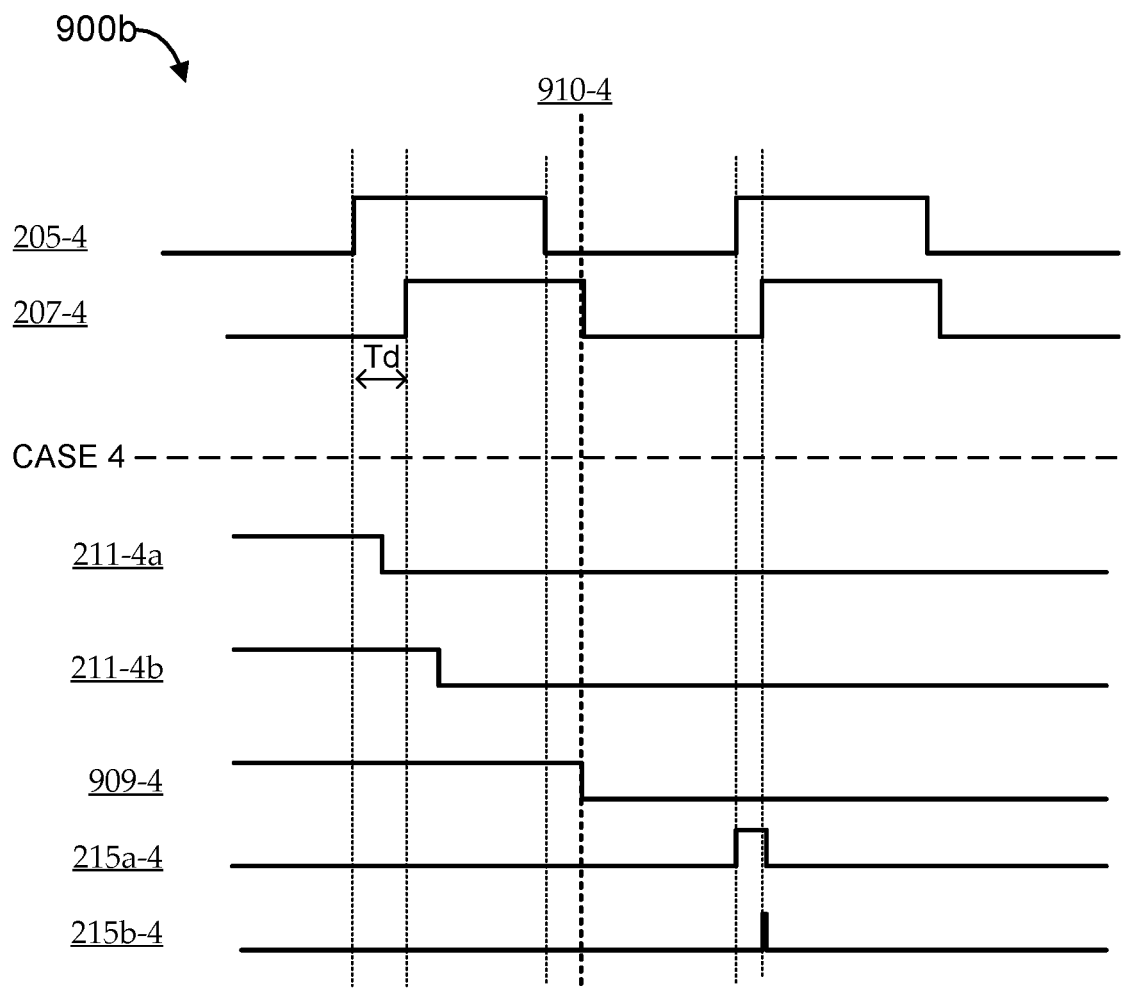

FIGS. 9A and 9B show example plots 900 to illustrate certain features associated with the feedback-pause-controlled implementations, according to various embodiments. In FIG. 9A, waveforms are shown of illustrative PLL_in 205 and PLL_fdbk 207 signals, where PLL_fdbk 207 is leading PLL_in 205 by a delay (Td). FIG. 9B shows a case where PLL_fdbk 207 is lagging PLL_in 205 by a delay (Td). Four illustrative cases are shown in FIGS. 9A and 9B (labeled "Case 1," "Case 2," "Case 3," and "Case 4," respectively). The first and second cases illustrate conventional operation according to a conventional pause signal 211; and the third and fourth cases illustrate FPC operation according to a FPC signal 809. The context of the plots 900 generally assumes that the effective pause signal as seen by the phase detector (e.g., pause signal 211 for the first two cases, or FPC signal 809 for the last two cases) was previously asserted to switch the PLL to open loop operation. At some time 910, the pause signal is de-asserted, for example, in response to detecting that a clock reference has become reliable, such that it is desirable to return the PLL to closed loop (carrier tracking) mode.

Turning to Case 1, conventional pause signal 211-1 de-asserts asynchronously with respect to any of the other illustrated signals at time 910-1. The de-assertion happens to occur just before a rising edge of PLL_fdbk 207. With the phase detector in normal tracking mode (as the pause signal 211-1 has been de-asserted), this rising edge of PLL_fdbk 207 triggers assertion of phase tracking signal 215b-1. Subsequently, a rising edge of PLL_in 205 is detected, triggering assertion of phase tracking signal 215a-1, which triggers a reset. Essentially the same thing can continue to repeat for each subsequent PLL operating cycle (i.e., at each next set of rising edges). In this case, the timing of de-assertion of the pause signal 211-1 happens to support operation of the phase detector in a manner that, from the first cycle, effectively decrease the phase discrepancy between PLL_fdbk 207 and PLL_in 205 in each cycle and result in a fast settle time.

In Case 2, conventional pause signal 211-2 again de-asserts asynchronously, this time just after a rising edge of PLL_fdbk 207 at time 910-2; so just before a rising edge of PLL_in 205. Even though PLL_fdbk 207 is leading PLL_in 205, it appears to the PLL as the opposite case (because the rising edge of PLL_in 205 is detected first). With the phase detector in normal tracking mode (as the pause signal 211-2 has been de-asserted), this rising edge of PLL_in 205 triggers assertion of phase tracking signal 215a-2. The next rising edge of PLL_fdbk 207 is not until the next PLL operating cycle. As such, phase tracking signal 215a-2 remains asserted for almost an entire PLL operating cycle before the next rising edge of PLL_fdbk 207 is finally detected, triggering assertion of phase tracking signal 215b-2 and a corresponding reset. In each cycle, the PLL is making compensation determinations that effectively increase the phase discrepancy between PLL_fdbk 207 and PLL_in 205. The same thing can continue to repeat for each subsequent PLL operating cycle (i.e., at each next set of rising edges) until the discrepancy is so large as to begin triggering the opposite response from the phase detector. In this case, the timing of de-assertion of the pause signal 211-2 is such that the phase detector makes initial compensation decisions that increase the phase discrepancy between PLL_fdbk 207 and PLL_in 205, increasing the time before the PLL can settle.

As noted above, Case 3 represents a FPC operation scenario. As such, pausing of the PLL tracking is based on a FPC signal 809-3, which effectively waits until a next falling edge of PLL_fdbk 207 before de-asserting at time 910-3. For example, in Case 3, the FPC signal 809-3 could be responsive to pause signal 211-1 or pause signal 211-2; in either case, the FPC signal 809-3 would de-assert at the next falling edge of PLL_fdbk 207, which is time 910-3. Thus, regardless of the timing of de-assertion of the pause signal 211 relative to PLL_in 205 and PLL_fdbk 207, the phase detector makes the correct compensation determinations (i.e., to effectively decrease the phase discrepancy between PLL_fdbk 207 and PLL_in 205 from the first cycle).

Case 4 in FIG. 9B represents another FPC operation scenario in which PLL_fdbk 207 is lagging PLL_in 205 by a delay (Td). Similar to Case 3, pausing of the PLL tracking is based on FPC signal 809-4, which effectively waits until a next falling edge of PLL_fdbk 207 before de-asserting at time 910-4. For context, two different timing scenarios are shown for a pause signal 211-4 from which the FPC signal 809-4 may be generated. It can again be seen that, regardless of the timing of the pause signal 211-4, the FPC signal 809-4 de-asserts at a time that results in the phase detector making correct compensation determinations (i.e., to effectively decrease the phase discrepancy between PLL_fdbk 207 and PLL_in 205 from the first cycle).

Figure 10:
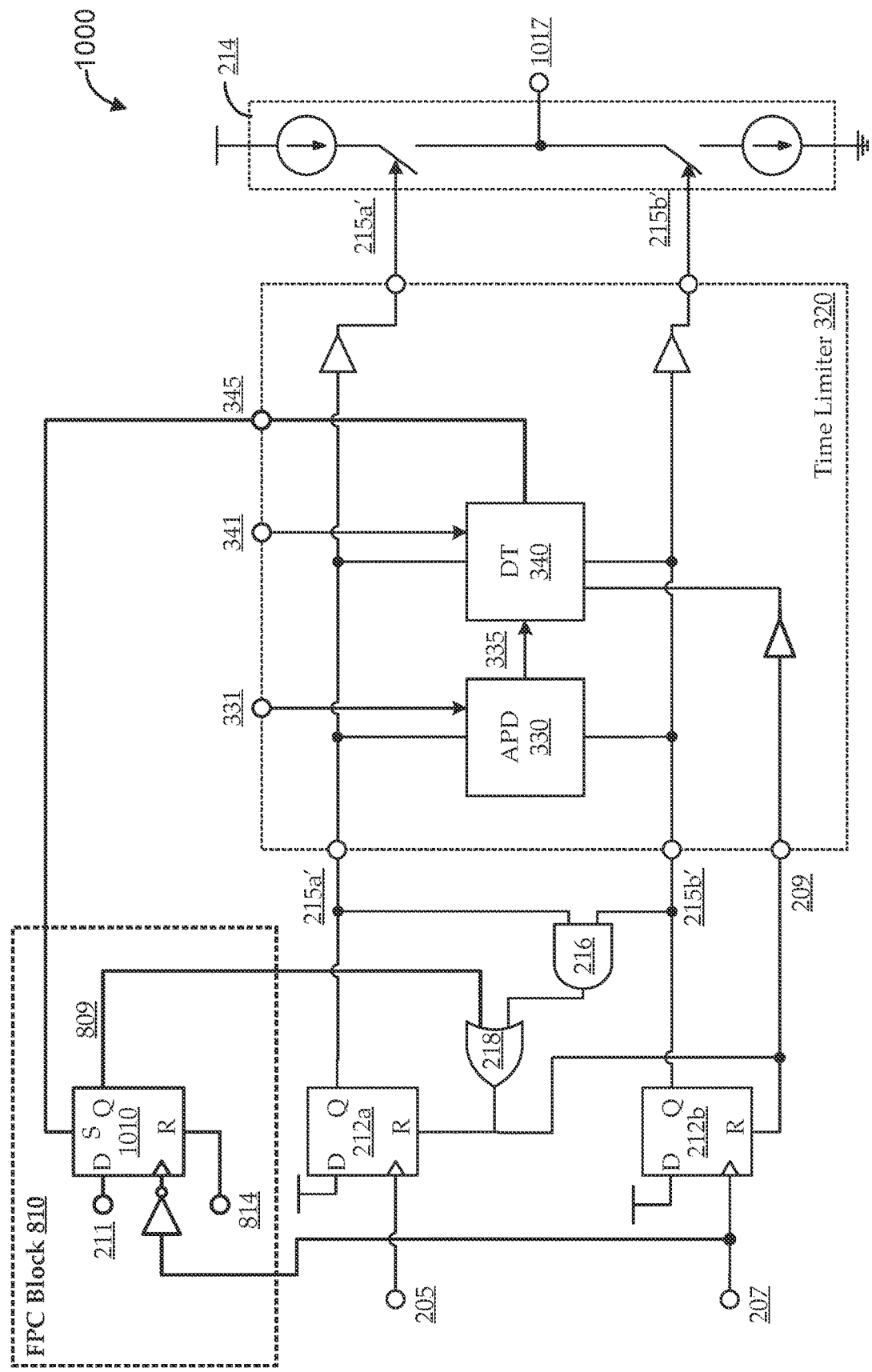
FIG. 10 shows an illustrative feedback-pause-controlled phase detector 1000 with time limiting, according to various embodiments.

FIG. 10 shows an illustrative feedback-pause-controlled phase detector 1000 with time limiting, according to various embodiments. The phase detector 1000 can be an implementation of the phase comparison block 210 of the PLL circuit 200 of FIG. 2A, which can be included in an implementation of the clock module 150 of the CE device 120 of FIG. 1. As in the phase detector 300 of FIG. 3, embodiments of the phase detector 1000 include an edge detector 310, a time limiter 320, and a charge pump 214. The phase detector 1000 of FIG. 10 also includes an FPC block 810 to implement feedback-pause-controlled enabling of the PLL. Embodiments of the edge detector 310 and the charge pump 214 can include similar components to, and can operate in a similar manner to, similarly labeled components of the phase detector 800 of FIG. 8. As described above, the edge detector 310 can use flip-flops 212, or other suitable components, to detect an edge (e.g., a rising edge) of a PLL_in 205 signal (the clock reference signal) and a PLL_fdbk 207 signal (feedback from the internal clocking signal generated by the PLL). When the PLL_in 205 edge is detected, a first phase tracking signal 215a is asserted; when a PLL_fdbk 207 edge is detected, a second phase tracking signal 215b is asserted; and when both phase tracking signals 215 are asserted, a set of logic gates (AND gate 216 and OR gate 218) assert a reset signal to reset the flip flops 212 until the next loop iteration of the PLL.

Embodiments of the time limiter 320 can operate in a similar manner to those described with reference to FIG. 3 and/or FIG. 4. For example, embodiments include an absolute phase detection (APD) sub-circuit 330 and a delay timer sub-circuit 340. As described below, the embodiments of FIG. 10 do not explicitly include a pulse gating sub-circuit 350; pulse gating functionality is instead implemented via functionality of the FPC block 810.

Embodiments of the APD sub-circuit 330 can detect whether a phase tracking signal 215 (one of the first or the second phase tracking signals 215) is asserted by the edge detector 310 in a present operating cycle of the PLL. As described herein, the phase tracking signal 215 indicates a detected phase difference between PLL_fdbk 207 and PLL_in 205. The APD sub-circuit 330 can output an absolute phase signal 335 responsive to detecting a phase difference between PLL_fdbk 207 and PLL_in 205 based on the phase tracking signal 215, such that the absolute phase signal 335 is asserted regardless of the direction of the phase difference (i.e., regardless of whether PLL_fdbk 207 is leading or lagging PLL_in 205). Embodiments of the delay timer sub-circuit 340 are coupled with the APD sub-circuit 330 to determine whether a signal duration of an asserted phase tracking signal 215 exceeds a threshold duration. The threshold duration can be fixed or adjustable (e.g., responsive to a duration adjustment signal 341). Embodiments of the APD sub-circuit 330 can determine whether the signal duration exceeds the threshold duration based on the absolute phase signal 335. For example, when the absolute phase signal 335 is asserted, a delay time begins to record a duration during which the absolute phase signal 335 is asserted. If the delay timer sub-circuit 340 detects that the duration has reached or exceeded a threshold duration, the delay timer sub-circuit 340 can assert a gate trigger signal 345.

As illustrated, the gate trigger signal 345 can be fed back as an additional control signal for the FPC block 810. The illustrated implementation shows the FPC block 810 as having a flip-flop 1010 with active-high, asynchronous inputs. Alternatively, active-low inputs can be used with complements of the illustrated signals. As in FIG. 8, an output node is coupled with the FPC signal 809, and the clocking input node is coupled with the complement of PLL_fdbk 207 (e.g., coupled with PLL_fdbk 207 via an inverter). Normally, (when not being globally reset), the global reset signal 814 is held de-asserted at the asynchronous-clear input.

As described herein, when time limiting is disabled, or when there is no gate trigger signal 345 that has been asserted for longer than the threshold duration, the gate trigger signal 345 is de-asserted at the asynchronous-preset input. With both the asynchronous-clear input and the asynchronous-preset input de-asserted in such an active-high configuration, the flip-flop 1010 operates in a normal "flop mode," such as described in FIG. 8. In that mode, the FPC signal 809 generally tracks the externally controlled pause signal at the data input, except that any change in the state of the externally controlled pause signal only propagates to the FPC signal 809 at a next falling edge of PLL_fdbk 207 (when the clock input of the flip-flop 1010 is triggered). As such, when the gate trigger signal 345 is not presently being asserted, the flip-flop 1010 operates substantially as the flip-flop 812 of FIG. 8.

When the gate trigger signal 345 is asserted, the asynchronous-preset input becomes asserted. With the asynchronous-preset input asserted and the asynchronous-clear input still de-asserted, the flip-flop 1010 operates in a "set mode," which forces assertion of the output (the FPC signal 809). The asserted gate trigger signal 345 causes a reset of flip-flops 212 and a corresponding reset (de-assertion) of the phase tracking signals 215. Thus, assertion of the gate trigger signal 345 effectively forces time-limited gating of the phase tracking signals 215, such that the phase tracking signals 215 essentially become the time-limited phase tracking signals 215' described with reference to FIGS. 3-7.

Notably, the effect of the time limiting can be different in this type of implementation than in those described with reference to FIGS. 3-7. As described above, the time-limiting is triggered by assertion of either of the phase tracking signals 215 exceeding the threshold duration set by the delay timer 340. According to implementations, such as that of FIG. 3, the time-limiting determination may only be made once each time the PLL switches into open-loop operation (e.g., in those implementations, when the clock reference is absent, there may be no rising edge of PLL_in 205 to force a reset). According to the implementation of FIG. 10, however, the gate trigger signal 345 may force a reset in each operating cycle of the PLL. As such, the time-limiting may repeatedly occur, in each PLL cycle, during at least a part of the time when the PLL is operating in the open-loop mode.

Figure 11:
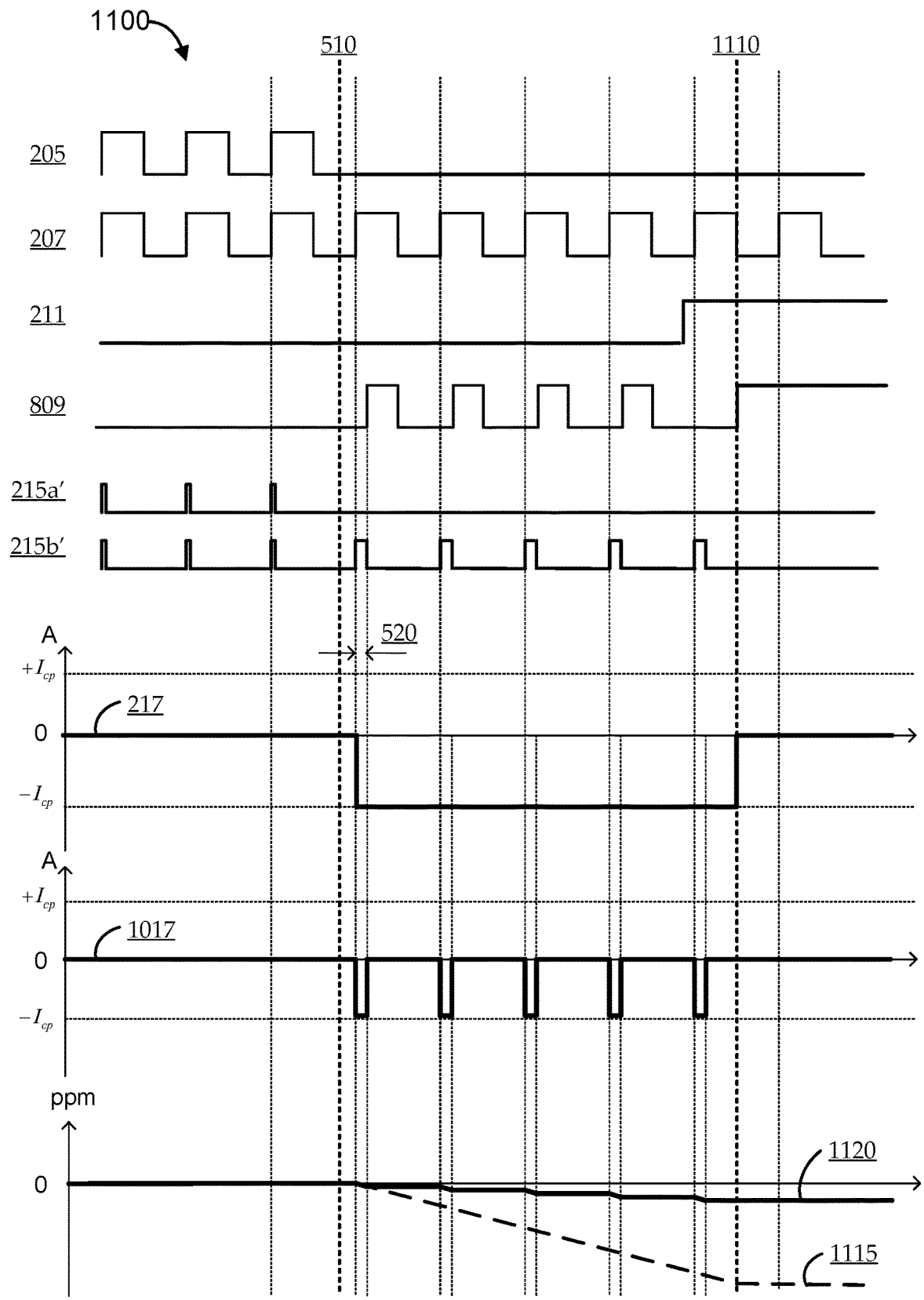
FIG. 11 shows illustrative plots 1100 of various signals to illustrate operation of a FPC phase detector with time-limiting, such as the one described in FIG. 10.

FIG. 11 shows illustrative plots 1100 of various signals to illustrate operation of a FPC phase detector with time-limiting, such as the one described in FIG. 10. The plots can be compared to those of FIGS. 5 and 6 for added clarity. The plots 1100 generally begin in a timeframe when steady state has been reached, such that the clock reference is reliable, and the PLL has locked onto and is accurately tracking the clock reference. For example, the clock reference at PLL_in 205 is faithfully represented by PLL_fdbk 207. In such a steady state condition, at each rising edge of PLLin 205 and PLL_fdbk 207, the phase tracking signals 215 are briefly asserted, thereby triggering a reset. Notably, the time-limited phase tracking signals 215' are illustrated in the plots 1100, but those signals track the corresponding phase tracking signals 215 in steady state (e.g., the durations are well within the threshold duration 520).

At some time 510, the clock reference becomes unreliable (e.g., illustrated as immediately disappearing). It can be seen that, after this occurs, the next rising edge is necessarily from the PLL_fdbk 207 signal, which triggers assertion of the second phase tracking signal 215b. This is effectively a "down" signal, indicating to the PLL that its output is too fast, and compensation is need to slow the PLL output. Because the PLLin 205 has disappeared, no edge is detected for PLLin 205 in the operating cycle, and no signal is available to trigger a reset. As such, the second phase tracking signal 215b would conventionally remain asserted while PLL continues to attempt tracking of the unavailable clock reference.

As described with reference to FIG. 10, time-limiting can address this concern. When the duration of either phase tracking signal 215 exceeds the threshold duration 520, a gate trigger signal 345 is triggered. The gate trigger signal 345 can be fed back to the FPC block 810 to asynchronously force a reset. This can be seen in the plots of time-limited phase tracking signal 215b' and the FPC signal 809. In each cycle of the PLL subsequent to time 510, the rising edge of PLL_fdbk 207 triggers assertion of the second time-limited phase tracking signal 215b'. After the threshold duration 520 is reached, the gate trigger signal 345 forces asynchronous assertion of the FPC signal 809 via the FPC block 810, which forces a reset of the second time-limited phase tracking signal 215b'. During each time when the second time-limited phase tracking signal 215b' is asserted, the output current 1017 of the charge pump is pulled to a negative level (−I_cp). At the next falling edge of PLL_fdbk 207, the state of pause signal 211 propagates back to the output of the FPC block 810, and effectively de-asserts the FPC signal 809. At some time 1110, the unreliable clock reference is detected, and the pause signal 211 is asserted. At the next falling edge of PLL_fdbk 207, the asserted state of pause signal 211 is reflected by FPC signal 809 (via FPC block 810).

The bottom-most graph of FIG. 11 shows two plots of relative frequency error between PLL_fdbk 207 and PLLin 205. The first relative frequency error plot 1115 corresponds to the plot of charge pump current 217 without FPC time-limiting. It can be seen that, in the timeframe between time 510 and time 1110, the magnitude of frequency error rapidly and continuously increases (i.e., moves away from zero). The second relative frequency error plot 1120 corresponds to the plot of charge pump current 1017 with FPC time-limiting. It can be seen that, in the timeframe between time 510 and time 1110, the magnitude of frequency error still increases, but only slightly. In particular, the magnitude of phase error (corresponding to the frequency error) primarily changes only during each small window (in each loop iteration of the PLL) when the time-limited phase tracking signal 215' is asserted, corresponding to the threshold duration 520. It can be seen that the phase error resulting from the PFC time-limiting of FIG. 10 may be greater than that resulting from time-limiting of FIG. 3 or FIG. 4, but the phase error in either case is appreciably less than that of conventional operation (e.g., as in FIG. 2B). In some cases, the PFC time-limiting of FIG. 10 may also result in phase error that is less than that resulting from time-limiting of FIG. 3 or FIG. 4 (e.g., depending on the frequency of the received RF carrier while the RF carrier is unreliable).

The plots 1100 of FIG. 11 generally illustrate cases before a pause. For example, a reliable clock reference is lost, and it takes some time until a pause signal is asserted that causes the PLL to switch into open loop mode. The plots 1100 illustrate ways in which FPC time-limiting approaches can help mitigate the effects of incorrect carrier tracking during that timeframe. As noted above, similar concerns can occur after a pause, which the PLL is returned to closed-loop operation. For example, FPC techniques described herein can help ensure that the phase detector begins making the correct compensation determinations as quickly as possible after the PLL returns to closed-loop mode, so that the PLL can lock back onto the again-reliable clock reference as quickly as possible.

Figure 12A:
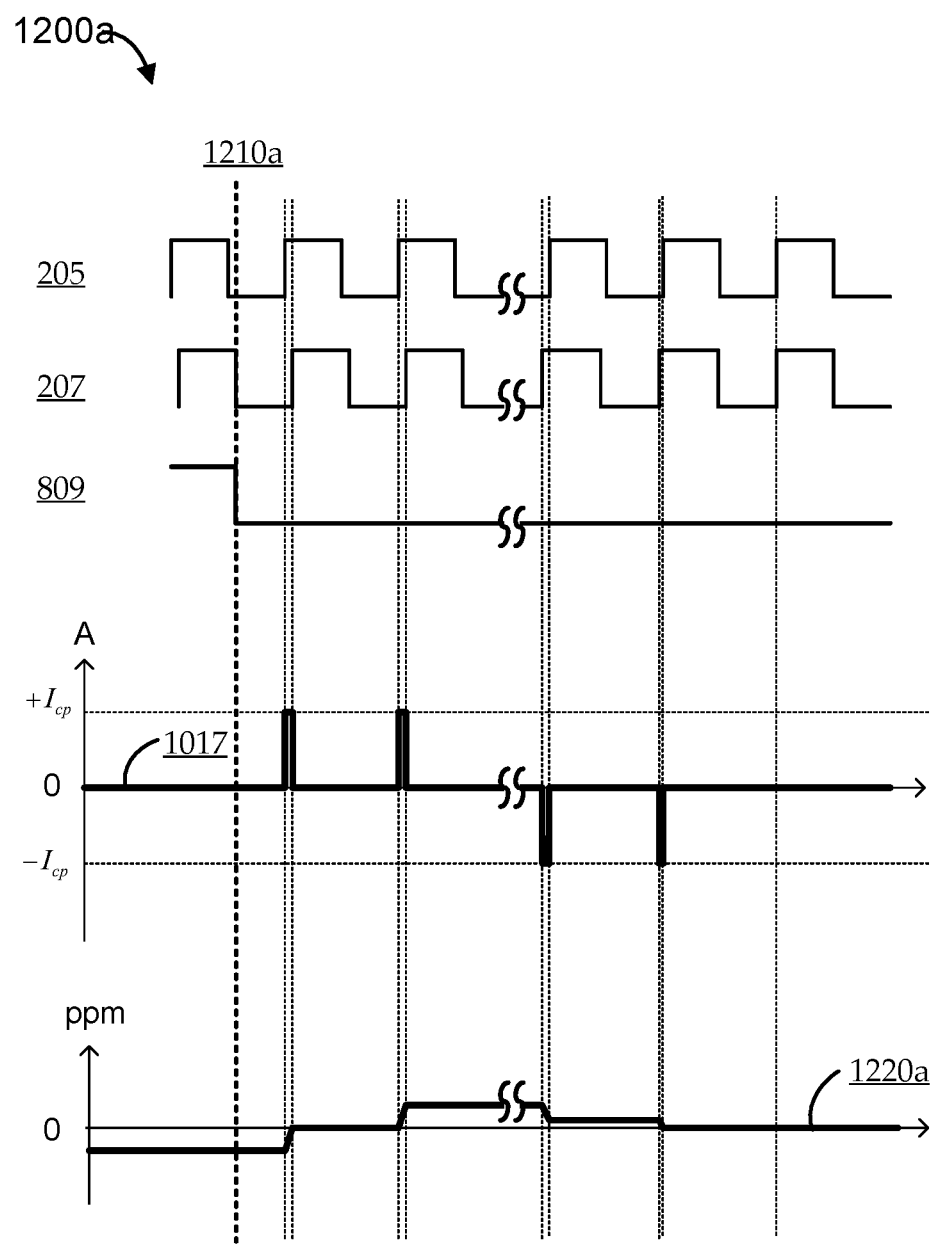
FIGS. 12A-12C show illustrative plots 1200 of various signals to illustrate operation of a FPC phase detector with time-limiting immediately after the PLL returns to closed-loop mode.
Figure 12B:
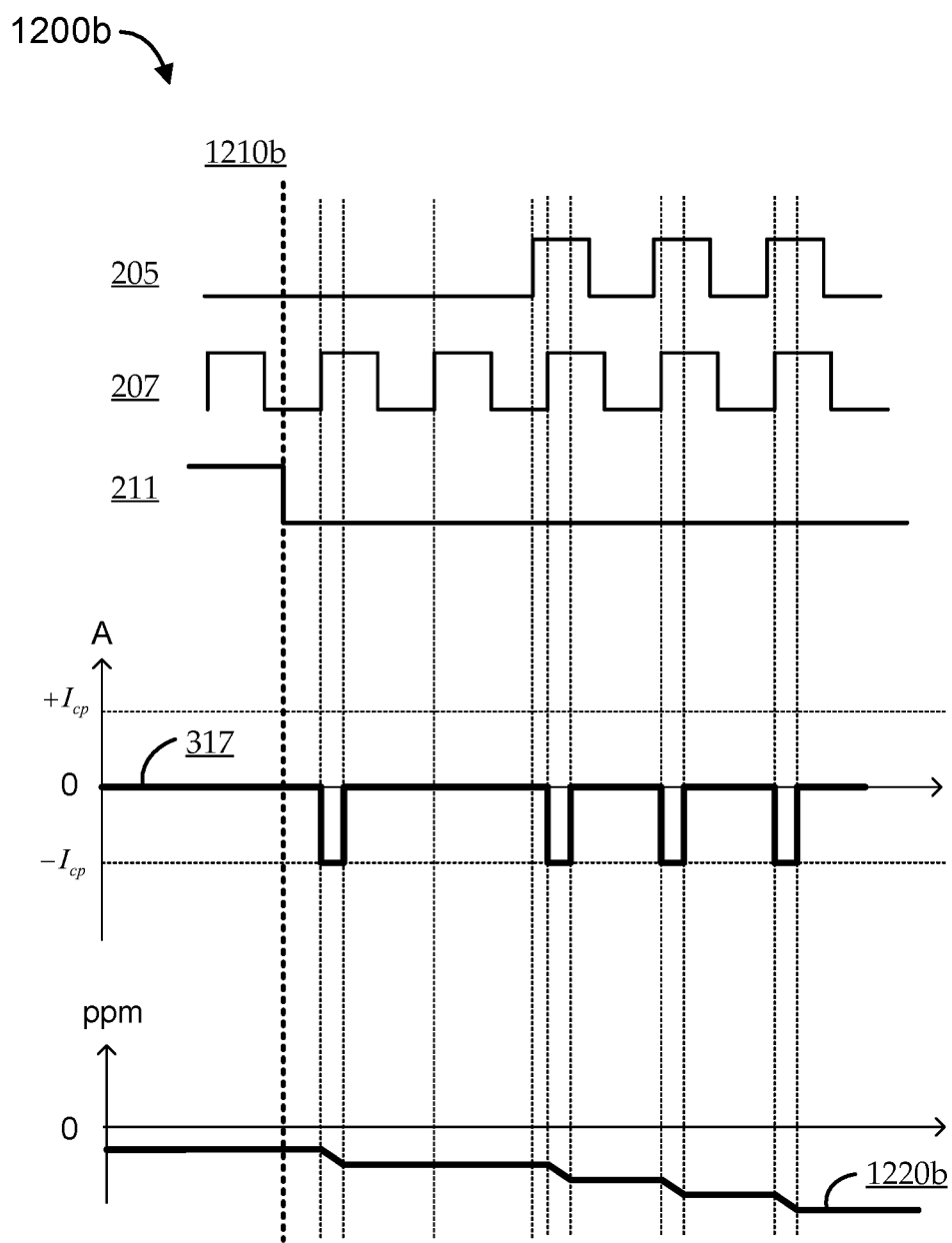
Figure 12C:
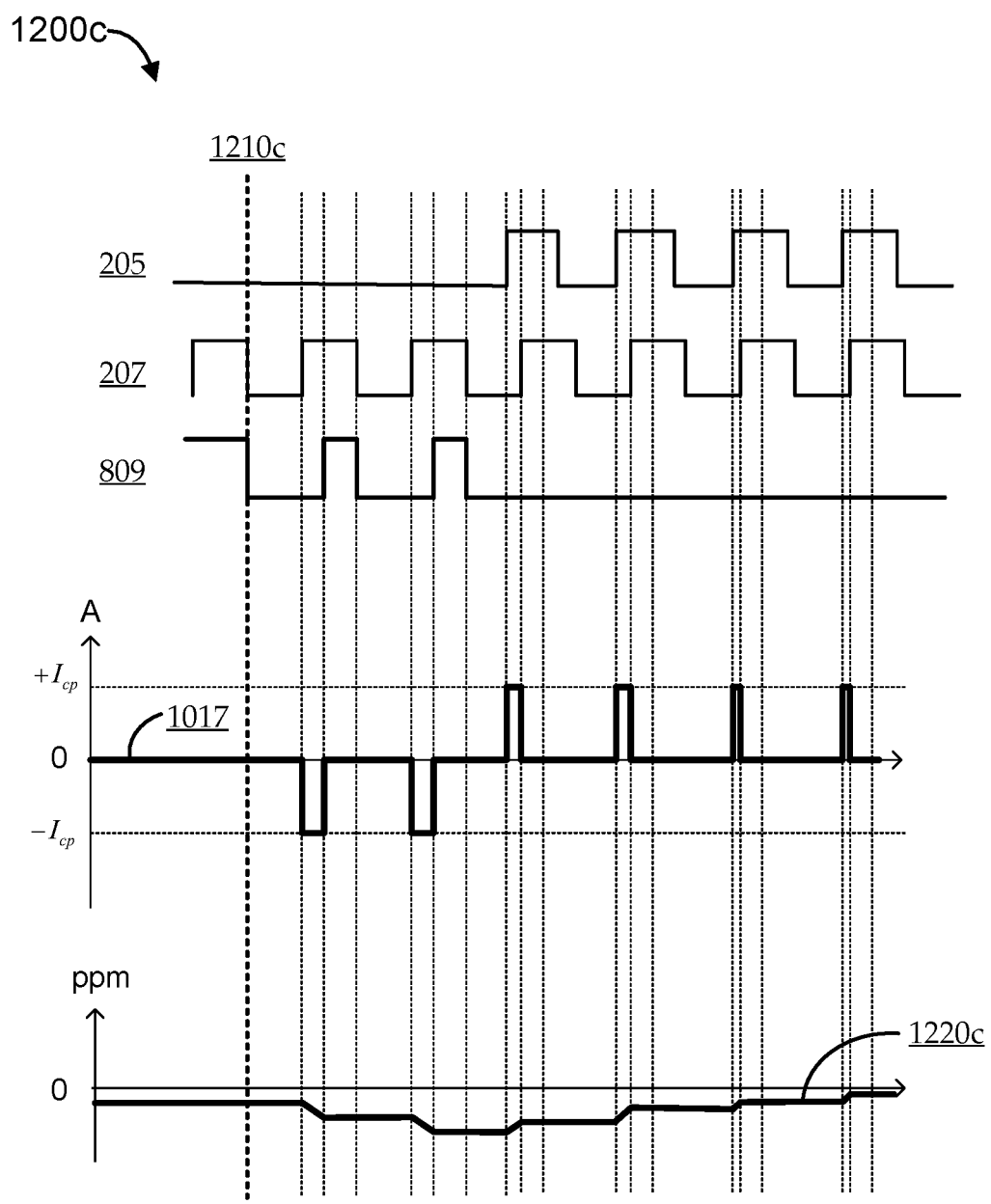

FIGS. 12A-12C show illustrative plots 1200 of various signals to illustrate operation of a FPC phase detector with time-limiting immediately after the PLL returns to closed-loop mode. Turning first to FIG. 12A, illustrative PLL_in 205 and PLL_fdbk 207 are shown, and PLL_fdbk 207 slightly lags PLL_in 205 at the beginning of the illustrated timeframe (at the end of the time during which the PLL was operating open-loop). A pause signal 211 is assumed to have been de-asserted, such that the FPC signal 809 de-asserts at the next falling edge of PLL_fdbk 207, shown as time 1210a. In the illustrated case of FIG. 12A, time-limiting may not be needed.

For example, the next detected edge is the next rising edge of PLL_in 205, which triggers assertion of an up signal (not shown) and a corresponding pushing of the output current 1017 of the charge pump up to a positive level (+I_cp). Soon thereafter, the next rising edge of PLL_fdbk 207 is detected, causing a momentary assertion of a down signal (not shown) and a corresponding reset. The reset also resets the output current 1017 of the charge pump. As shown in the bottom-most graph of FIG. 12A, the relative frequency error 1220a between PLL_fdbk 207 and PLLin 205 decreases (moves toward zero) in response to the increased charge pump current over the window prior to the reset. At some subsequent time, the PLL has over-compensated, and PLL_fdbk 207 now slightly leads PLL_in 205. Here, the next detected edge is the next rising edge of PLL_fdbk 207, which triggers assertion of the down signal and a corresponding pulling of the output current 1017 of the charge pump down to the negative level (−I_cp). Soon thereafter, the next rising edge of PLL_in 205 is detected, causing a momentary assertion of the up signal and a corresponding reset. The reset again resets the output current 1017 of the charge pump. Again, it can be seen that the relative frequency error 1220a between PLL_fdbk 207 and PLLin 205 decreases (moves toward zero) in response to the decreased charge pump current over the window prior to the reset. Eventually, the relative frequency error 1220a tends to zero (e.g., remains at a level within a predetermined acceptable margin close to zero, or varies over a range of values within such a predetermined acceptable margin).

FIG. 12B shows a scenario of undesirable pause timing for a phase detector having time-limiting, but no FPC functionality (e.g., as in FIGS. 3 and 4). Illustrative PLL_in 205 and PLL_fdbk 207 are shown. For some reason, a pause signal 211 has been de-asserted at time 1210b, even though the clock reference is still absent. The next detected edge is the next rising edge of PLL_fdbk 207, which triggers assertion of a down signal (not shown) and a corresponding pulling of the output current 317 of the charge pump down to a negative level (−I_cp). With the clock reference still absent, there is no rising edge of the PLL_in 205 for a few cycles, and no corresponding reset. However, as described above, the time-limiting ensures that the down signal de-asserts after the duration threshold, and the output current 317 effectively resets. Thus, as shown in the bottom-most graph of FIG. 12B, the relative frequency error 1220b between PLL_fdbk 207 and PLLin 205 increases prior to the reset, but only during the threshold duration.

At some point, the clock reference returns, triggering a reset. Even though PLL_in 205 restarted with a phase that leads PLL_fdbk 207, the next rising edge detected after the reset is that of PLL_fdbk 207. As such, the PLL begins to compensate in the incorrect direction. Thus, in each subsequent cycle of the PLL for some time, the down signal is again asserted, causing a corresponding pulling of the output current 317 of the charge pump down to the negative level (−I_cp) and a corresponding further increase in relative frequency error 1220b between PLL_fdbk 207 and PLLin 205 within the threshold duration window. At some point, the PLL will tend to correct and will begin to re-compensate in the correct direction (i.e., in the direction that reduces phase discrepancy between PLL_in 205 and PLL_fdbk 207); but it may take an appreciable amount of time for that to occur. In the meantime, the PLL will not be accurately tracking the clock reference, even though the reference is reliable.

FIG. 12C shows the scenario of undesirable pause timing of FIG. 12B, but for a phase detector having time-limiting and FPC functionality (e.g., as in FIG. 10). Illustrative PLL_in 205 and PLL_fdbk 207 signals are shown to be substantially the same as those of FIG. 12B. As noted in FIG. 12B, it is assumed that a pause signal 211 has been de-asserted, even though the clock reference is still absent; here, this is shown as causing the FPC signal 809 to de-assert at time 1210c, corresponding to a next falling edge of PLL_fdbk 207. The next detected edge is the next rising edge of PLL_fdbk 207, which triggers assertion of a down signal (not shown) and a corresponding pulling of the output current 1017 of the charge pump down to a negative level (−I_cp). With the clock reference still absent, there is no rising edge of the PLL_in 205 for a couple of cycles. However, as described above, feedback of the gate trigger signal 345 to the FPC block 810 can enable asynchronous FPC time-limiting. As such, when the down signal duration exceeds the duration threshold, the gate trigger signal 345 effectively forces a reset of the output current 1017.

Similar to FIG. 12B, the bottom-most graph of FIG. 12C shows the relative frequency error 1220c between PLL_fdbk 207 and PLLin 205 initially increasing prior to each effective reset during each threshold duration. However, the behavior of FIG. 12C is different after the clock reference returns. Because the FPC time-limiting effectively resets in each PLL loop iteration, as soon as the clock reference returns, the phase detector immediately begins to detect the correct phase relationship. In particular, as soon as PLL_in 205 restarts (with a phase that leads PLL_fdbk 207 in the illustrated case), its rising edge is detected in that same cycle. In response, an up signal is generated to increase output current 317 of the charge pump to effect per-cycle phase correction of PLL_fdbk 207 relative to PLL_in 205. Accordingly, the relative frequency error 1220c between PLL_fdbk 207 and PLLin 205 begins to decrease (move back toward zero) in each cycle.

It can be seen that, while the PLL without FPC time-limiting (e.g., in FIG. 12B) makes an incorrect initial compensation decision, the PLL with FPC time-limiting (e.g., in FIG. 12C) begins correctly compensating as soon as the clock reference returns. This effect can also be seen in FIG. 13, which shows illustrative plots 1220 of relative frequency error 1220 between PLL_fdbk 207 and PLLin 205 according to non-PFC-aided and PFC-aided scenarios. A first frequency error plot 1220b represents a scenario (e.g., as in FIG. 12B) in which the phase detector does not have FPC functionality, and a second frequency error plot 1220c represents a scenario (e.g., as in FIG. 12C) in which the phase detector has FPC functionality. Each plot 1220 generally represents a clock reference being lost and subsequently regained. At a time 510, the clock reference (e.g., PLL_in 205) is lost; at time 610, the PLL enters open-loop mode and stops tracking the reference; at time 1210, the clock reference returns, and the PLL returns to closed-loop mode.

In both plots 1220, between times 510 and 610, the frequency error increases as the PLL tracks an unreliable (e.g., absent) clock reference. As described above (e.g., with reference to FIGS. 3-7, 10, and 11), non-FPC-based and FPC-based time-limiting techniques can be used to limit the amount of phase error introduced during this time period. Between times 610 and 1210, there may be a further increase in phase error, for example, due to natural drift in the PLL in open-loop mode (when it is not tracking any stable reference). At time 1210, the first frequency error plot 1220b shows the PLL making an incorrect initial compensation determination right after the PLL loop closes, and the second frequency error plot 1220c shows the PLL making an correct initial compensation determination right after the PLL loop closes. It can be seen, after the incorrect initial compensation decisions in plot 1220b, the frequency error takes a significant time to correct and settle within a suitable frequency error margin. In contrast, the frequency error in plot 1220c moves initially in the correct direction (toward zero) and takes a relatively short time to settle within a suitable frequency error margin.

Figure 14:
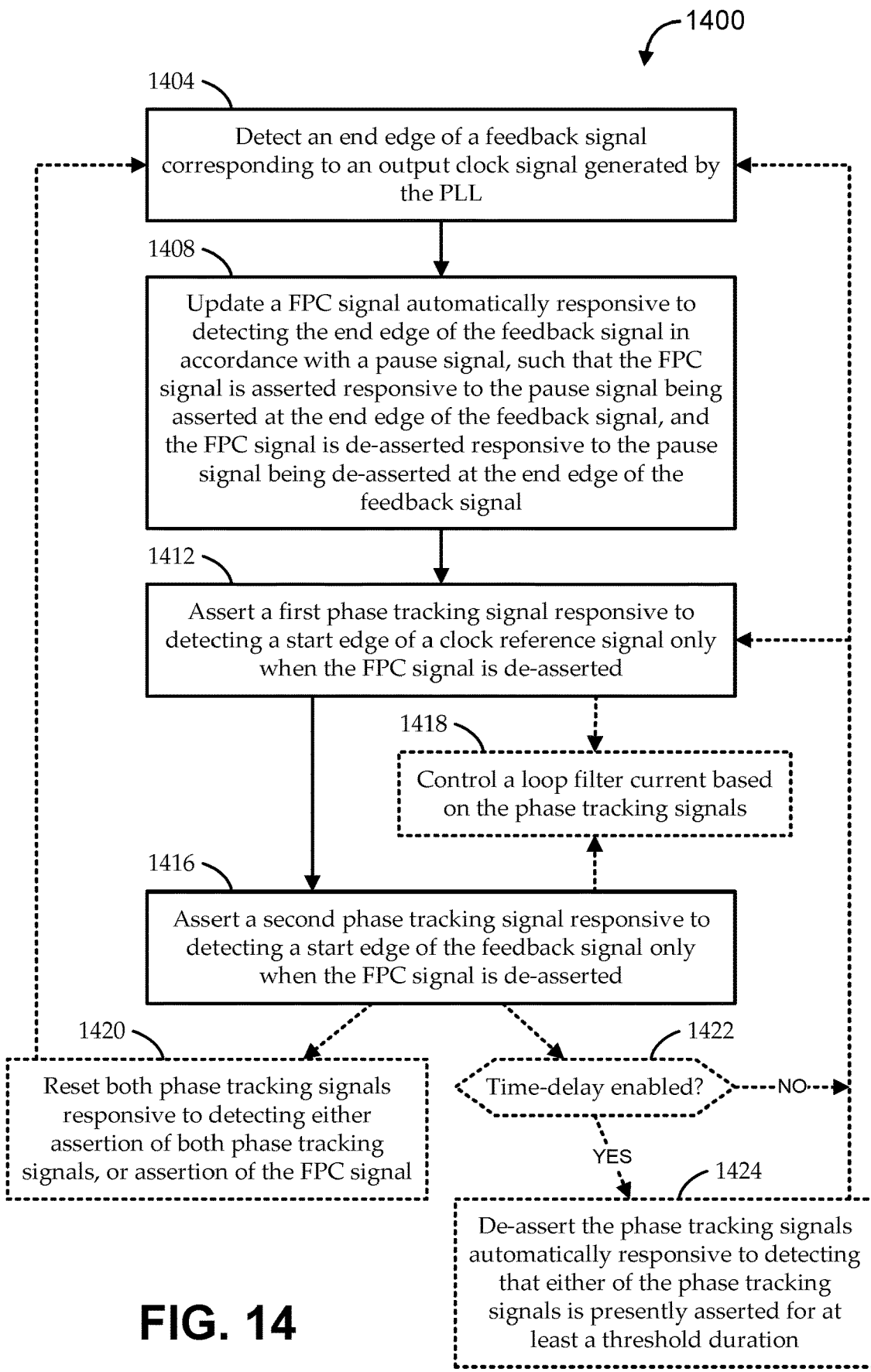
FIG. 14 shows a flow diagram of an illustrative method 1400 for phase detection with feedback-pause-control (FPC), according to various embodiments described herein.

FIG. 14 shows a flow diagram of an illustrative method 1400 for phase detection with feedback-pause-control (FPC), according to various embodiments described herein. Embodiments of the method 1400 begin at stage 1404 by detecting an end edge of a feedback signal corresponding to an output clock signal generated by a phase-locked loop (PLL). At stage 1408, embodiments can update a FPC signal automatically responsive to detecting the end edge of the feedback signal in accordance with a pause signal. The updating at stage 1408 is such that the FPC signal is asserted responsive to the pause signal being asserted at the end edge of the feedback signal, and the FPC signal is de-asserted responsive to the pause signal being de-asserted at the end edge of the feedback signal. At stage 1412, embodiments can assert a first phase tracking signal responsive to detecting a start edge of a clock reference signal only when the FPC signal is de-asserted. For example, stage 1412 is only performed after detecting that, or in response to detecting that, the FPC signal is de-asserted. At stage 1416, embodiments can assert a second phase tracking signal responsive to detecting a start edge of the feedback signal only when the FPC signal is de-asserted. In some embodiments, the terms "start edge" and "end edge" refer to a rising edge and a falling edge, respectively.

In some embodiments, stages 1404 and 1408 are continually iterated independent of other stages of the method 1400, except for their dependence on the feedback signal, which also affects other stages of the method 1400. In some embodiments, stages of the method 1400 are performed by a phase detector, and the pause signal is generated external to the phase detector (e.g., by a controller). The pause signal can indicate detection of a loss of reliability of the clock reference signal, such as due to a loss of the signal (e.g., during ASK modulation of the carrier) and/or possible phase corruption of the signal (e.g., during ALM, or at other times).

In some embodiments, at stage 1418, the method 1400 can control a loop filter current based on the phase tracking signals. For example, embodiments can trigger increasing of a loop filter current of the PLL to a positive current rail responsive to assertion of the first phase tracking signal, trigger decreasing of the loop filter current of the PLL to a negative current rail responsive to assertion of the second phase tracking signal, and trigger setting of the loop filter current of the PLL to a zero current level responsive to de-assertion of both the first phase tracking signal and the second phase tracking signal.

In some embodiments, at stage 1420, the method 1400 can reset both the first phase tracking signal and the second phase tracking signal responsive to detecting either assertion of both the first phase tracking signal and the second phase tracking signal, or assertion of the FPC signal. In some embodiments, at stage 1424, the method 1400 can de-assert the first phase tracking signal and the second phase tracking signal automatically responsive to detecting that the first phase tracking signal or the second phase tracking signal is presently asserted for at least a threshold duration. In some such embodiments, the de-asserting in stage 1424 is dependent on additional determinations. For example, at stage 1422, embodiments can determine whether time-limiting is enabled (e.g., based on a time-limit signal), and the de-asserting in stage 1424 can be performed only when time-limiting is enabled.

The de-asserting in stage 1424 can be performed in various ways, as described herein. In some embodiments, time-limiting circuitry generates a gate trigger signal, which can effectively force de-assertion of any asserted phase tracking signal until at least a reset occurs. Such an embodiment can be implemented by inserting the FPC block 810 of FIG. 8 into the phase detector 300 of FIG. 3. For example, the input node labeled to receive pause signal 211 can be coupled with the FPC block 810 of FIG. 8, such that OR gate 218 receives FPC signal 809 instead of pause signal 211. In other embodiments, time-limiting circuitry generates a gate trigger signal, which is fed back as an asynchronous assertion signal for the FPC block 810, such as in FIG. 10. In such embodiments, detection of either phase tracking signal being presently asserted for at least a threshold duration in stage 1424 can effectively cause asynchronous assertion of the FPC signal 809, regardless of the present state of the pause signal 211 and without waiting for a feedback signal end edge. Thus, the time-limiting at stage 1424 effectively drives de-assertion at stage 1424 vis asynchronous triggering of the FPC signal 809.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second." "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A phase detector of a phase-locked loop (PLL), the phase detector comprising:
   a reference edge detector to assert a first phase tracking signal responsive to detecting a start edge of a received clock reference signal;
   a feedback edge detector to assert a second phase tracking signal responsive to detecting start edge of a received feedback signal corresponding to an output clock signal generated by the PLL;
   feedback pause controller (FPC) block to assert a FPC signal responsive to detecting an end edge of the feedback signal subsequent to detecting assertion of a pause signal, wherein the pause signal is generated by a controller external to the phase detector responsive to the controller detecting a loss of reliability of the clock reference signal; and
   a reset network configured to assert a reset signal to reset the reference edge detector and the feedback edge detector responsive to detecting either assertion of both the first phase tracking signal and the second phase tracking signal, or assertion of the FPC signal.

2. The phase detector of claim 1, wherein the start edge of the feedback signal is a rising edge, and the end edge of the feedback signal is a falling edge.

3. The phase detector of claim 1, wherein the phase detector further comprises:
   a charge pump coupled to increase a loop filter current of the PLL responsive to assertion of the first phase tracking signal, and to decrease the loop filter current of the PLL responsive to assertion of the second phase tracking signal.

4. The phase detector of claim 1, wherein the phase detector further comprises:
   a time-limiter comprising:
      an absolute phase detection block to detect whether the first phase tracking signal or the second phase tracking signal is presently asserted;
      a delay timer block, coupled with the absolute phase detection block to detect whether a signal duration of the presently asserted first phase tracking signal or second phase tracking signal exceeds a threshold duration; and
      a pulse gating block, coupled with the delay timer block to de-assert the first phase tracking signal and the second phase tracking signal automatically responsive to the delay timer block determining that the signal duration exceeds the threshold duration at least until a next asserting of the reset signal.

5. The phase detector of claim 4, wherein:
   the time-limiter further comprises an enable input node to receive a time-limit enable signal; and
   the pulse gating block is to de-assert only when the time-limit enable signal is asserted.

6. The phase detector of claim 1, wherein the clock reference signal is an amplitude shift key (ASK) modulated radiofrequency carrier signal.

7. A method of feedback-pause-controlled phase detection in a phase-locked loop (PLL), the method comprising:
   detecting an end edge of a feedback signal corresponding to an output clock signal generated by the PLL;
   updating a FPC signal automatically responsive to detecting the end edge of the feedback signal in accordance with a pause signal, such that the FPC signal is asserted responsive to the pause signal being asserted at the end edge of the feedback signal, and the FPC signal is de-asserted responsive to the pause signal being de-asserted at the end edge of the feedback signal, wherein the pause signal is generated by an external controller responsive to the external controller detecting a loss of reliability of a clock reference signal;
   asserting a first phase tracking signal responsive to detecting a start edge of the clock reference signal only when the FPC signal is de-asserted; and
   asserting a second phase tracking signal responsive to detecting a start edge of the feedback signal only when the FPC signal is de-asserted.

8. The method of claim 7, further comprising:
   resetting both the first phase tracking signal and the second phase tracking signal responsive to detecting either assertion of both the first phase tracking signal and the second phase tracking signal, or assertion of the FPC signal.

9. The method of claim 7, wherein the start edge of the feedback signal is a rising edge, and the end edge of the feedback signal is a falling edge.

10. The method of claim 7, further comprising:
triggering increasing of a loop filter current of the PLL to a positive current rail responsive to assertion of the first phase tracking signal;
triggering decreasing of the loop filter current of the PLL to a negative current rail responsive to assertion of the second phase tracking signal; and
triggering setting of the loop filter current of the PLL to a zero current level responsive to de-assertion of both the first phase tracking signal and the second phase tracking signal.

11. The method of claim 7, further comprising:
de-asserting the first phase tracking signal and the second phase tracking signal automatically responsive to detecting that the first phase tracking signal or the second phase tracking signal is presently asserted for at least a threshold duration.

12. The method of claim 11, further comprising:
determining whether time-limiting is enabled; and
de-asserting the first phase tracking signal and the second phase tracking signal automatically responsive to detecting that the first phase tracking signal or the second phase tracking signal is presently asserted for at least a threshold duration only when the time-limiting is enabled.

13. A system comprising:
a phase-locked loop (PLL) circuit comprising:
  a PLL input node to receive a clock reference signal;
  a PLL output node to output a generated clock signal; and
  a phase detector, coupled with the PLL input node and the PLL output node to control a charge pump responsive to detecting a phase difference between the clock reference signal and a feedback signal corresponding to the generated clock signal, the phase detector comprising:
    a reference edge detector to assert a first phase tracking signal responsive to detecting a start edge of the clock reference signal;
    a feedback edge detector to assert a second phase tracking signal responsive to detecting a start edge of the feedback signal; and
    feedback pause controller (FPC) block to assert a FPC signal responsive to detecting an end edge of the feedback signal subsequent to detecting assertion of a pause signal, wherein the pause signal is generated by a controller external to the phase detector responsive to the controller detecting a loss of reliability of the clock reference signal.

14. The system of claim 13, wherein the phase detector further comprises:
a reset network configured to assert a reset signal to reset the reference edge detector and the feedback edge detector responsive to detecting either assertion of both the first phase tracking signal and the second phase tracking signal, or assertion of the FPC signal.

15. The system of claim 13, wherein the phase detector further comprises:
a time-limiter configured to de-assert the first phase tracking signal and the second phase tracking signal automatically responsive to detecting that the first phase tracking signal or the second phase tracking signal is presently asserted for at least a threshold duration.

16. The system of claim 13, further comprising:
the controller.

17. The system of claim 13, wherein the PLL circuit further comprises:
a loop filter, coupled with the charge pump, such that assertion of the first phase tracking signal increases current injection into the loop filter via the charge pump, and assertion of the second phase tracking signal decreases current injection into the loop filter via the charge pump.

18. The system of claim 13, further comprising:
a near-field wireless communication device having the PLL circuit integrated therein, the near-field wireless communication device configured to operate in a near field communication (NFC) card emulation (CE) mode to communicate wirelessly with a NFC reader according to a clock signal generated by the PLL circuit based on tracking of the clock reference signal received from the NFC reader.

* * * * *